(12) United States Patent
Poiesz et al.

(10) Patent No.: US 12,321,104 B2
(45) Date of Patent: Jun. 3, 2025

(54) SUBSTRATE HOLDER FOR USE IN A LITHOGRAPHIC APPARATUS

(71) Applicants: ASML NETHERLANDS B.V., Veldhoven (NL); ASML HOLDING N.V., Veldhoven (NL)

(72) Inventors: Thomas Poiesz, Veldhoven (NL); Coen Hubertus Matheus Baltis, Eindhoven (NL); Abraham Alexander Soethoudt, Eindhoven (NL); Mehmet Ali Akbas, Cheshire, CT (US); Dennis Van Den Berg, Eindhoven (NL); Wouter Vanesch, Lummen (BE); Marcel Maria Cornelius Franciscus Teunissen, Grathem (NL)

(73) Assignees: ASML NETHERLANDS B.V., Veldhoven (NL); ASML HOLDING N.V., Veldhoven (NL)

( * ) Notice: Subject to any disclaimer, the term of this patent is extended or adjusted under 35 U.S.C. 154(b) by 105 days.

(21) Appl. No.: 17/870,444

(22) Filed: Jul. 21, 2022

(65) Prior Publication Data

US 2022/0357675 A1 Nov. 10, 2022

Related U.S. Application Data

(63) Continuation of application No. 16/770,464, filed as application No. PCT/EP2018/082175 on Nov. 22, 2018, now Pat. No. 11,448,976.

(30) Foreign Application Priority Data

Dec. 13, 2017 (EP) .................................... 17206912
Jul. 12, 2018 (EP) .................................... 18183119

(51) Int. Cl.
*G03F 7/20* (2006.01)
*G03F 7/00* (2006.01)
*H01L 21/687* (2006.01)

(52) U.S. Cl.
CPC .... *G03F 7/70716* (2013.01); *H01L 21/68735* (2013.01); *H01L 21/6875* (2013.01); *H01L 21/68757* (2013.01)

(58) Field of Classification Search
CPC .. G03F 7/70716; G03F 7/707; G03F 7/70783; G03F 7/70908; G03F 7/70691;
(Continued)

(56) References Cited

U.S. PATENT DOCUMENTS

| 5,923,408 A | 7/1999 | Takabayashi |
| 6,232,615 B1 | 5/2001 | Van Empel |

(Continued)

FOREIGN PATENT DOCUMENTS

| CN | 102193332 | 9/2011 |
| EP | 1641028 A1 | 3/2006 |

(Continued)

OTHER PUBLICATIONS

International Search Report dated Feb. 19, 2019 issued in corresponding International Patent Application No. PCT/EP2018/082175.

(Continued)

*Primary Examiner* — Mesfin T Asfaw
(74) *Attorney, Agent, or Firm* — Pillsbury Winthrop Shaw Pittman, LLP

(57) ABSTRACT

A substrate holder, for a lithographic apparatus, having a main body, a plurality of support elements to support a substrate and a seal unit. The seal unit may include a first seal positioned outward of and surrounding the plurality of support elements. A position of a substrate contact region of (Continued)

an upper surface of the first seal may be arranged at a distance from the plurality of support elements sufficient enough such that during the loading/unloading of the substrate, a force applied to the first seal by the substrate is greater than a force applied to the plurality of support elements by the substrate. A profile of the contact region, in a cross section through the seal, may have a shape which is configured such that during the loading/unloading of the substrate, the substrate contacts the seal via at least two different points of the profile.

20 Claims, 8 Drawing Sheets

(58) Field of Classification Search
CPC .......... H01L 21/68735; H01L 21/6875; H01L 21/68757; H01L 21/67126
See application file for complete search history.

(56) References Cited

U.S. PATENT DOCUMENTS

| | | | |
|---|---|---|---|
| 6,952,253 | B2 | 10/2005 | Lof et al. |
| 7,119,885 | B2 | 10/2006 | Ottens et al. |
| 9,081,311 | B2 | 7/2015 | Vogel et al. |
| 9,952,253 | B2 | 4/2018 | Ummethala et al. |
| 9,971,252 | B2 | 5/2018 | Kunnen et al. |
| 10,551,752 | B2 | 2/2020 | Ten Kate et al. |
| 10,747,125 | B2 | 8/2020 | Lafarre et al. |
| 2004/0036850 | A1* | 2/2004 | Tsukamoto ............. G03F 7/707 355/75 |
| 2005/0002010 | A1 | 1/2005 | Zaal et al. |
| 2005/0117141 | A1 | 6/2005 | Ottens et al. |
| 2005/0248746 | A1 | 11/2005 | Zaal et al. |
| 2008/0049209 | A1 | 2/2008 | Nagasaka et al. |
| 2013/0094005 | A1* | 4/2013 | Kunnen ............. G03F 7/70716 355/30 |
| 2013/0094009 | A1* | 4/2013 | Lafarre ............... G03F 7/70341 355/72 |
| 2014/0368804 | A1 | 12/2014 | Lafarre et al. |
| 2015/0206785 | A1 | 7/2015 | Miyashita et al. |
| 2017/0036272 | A1 | 2/2017 | Lafarre et al. |

FOREIGN PATENT DOCUMENTS

| | | |
|---|---|---|
| JP | 2004343110 | 12/2004 |
| JP | 2005079566 | 3/2005 |
| JP | 2008501244 | 1/2008 |
| KR | 2016-0125538 A | 10/2016 |
| TW | 201300964 A | 1/2013 |
| TW | 201310176 A | 3/2013 |
| WO | 99/49504 | 9/1999 |
| WO | 2017/054991 A1 | 4/2017 |
| WO | 2017/060028 A1 | 4/2017 |
| WO | 2017/102162 A1 | 6/2017 |
| WO | 2017/137129 A1 | 8/2017 |

OTHER PUBLICATIONS

"Bowed Wafer Flattening with Help of an Edge Landing Ring", Research Disclosure, Kenneth Mason Publications, Hampshire, UK, vol. 642, No. 31, Oct. 1, 2017, 6 pgs.

"Segmented Clamping of Warped Substrates with Pressure Control in Substrate Table Clamping Sections", Research Disclosure, Kenneth Mason Publications, Hampshire, UK, vol. 641, No. 65, Sep. 1, 2017, 6 pgs.

Japanese Office Action issued in corresponding Japanese Patent Application No. 2020-525978, dated Jul. 2, 2021.

Notification of Reasons for Refusal dated Jan. 11, 2022, issued in corresponding Korean Patent Application No. 10-2020-7017044 with English translation (14 pgs.).

Office Action dated Dec. 7, 2022, issued in corresponding Taiwanese Patent Application No. 110103590 with English translation (7 pgs.).

Notice of Reasons for Rejection dated Aug. 21, 2023, issued in corresponding Japanese Patent Application No. 2022-168050 with English translation (4 pgs.).

Notification of Reasons for Refusal dated Dec. 26, 2022, issued in corresponding Korean Patent Application No. 10-2022-7028241 with English translation (14 pgs.).

* cited by examiner

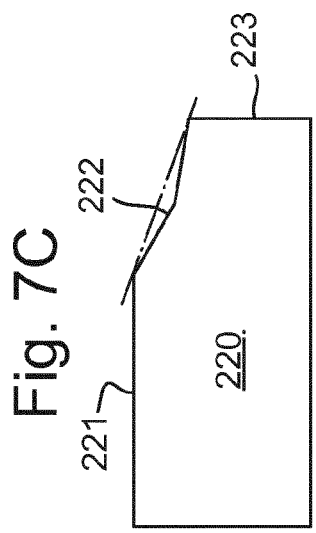
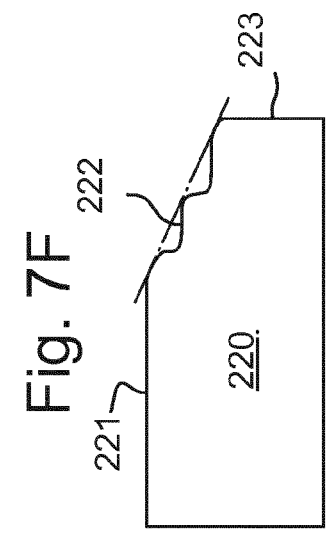
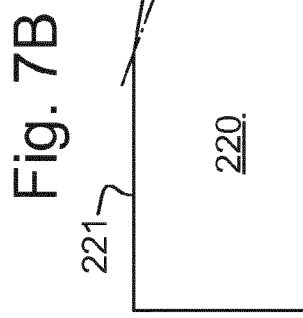
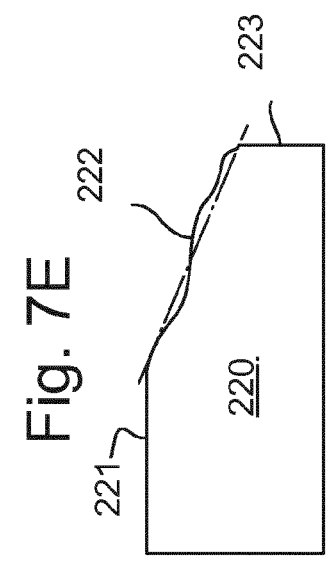
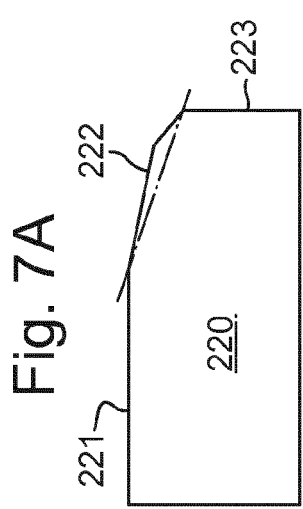
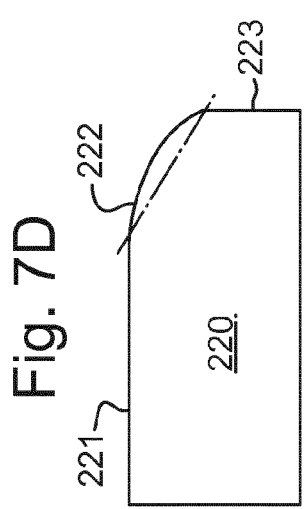
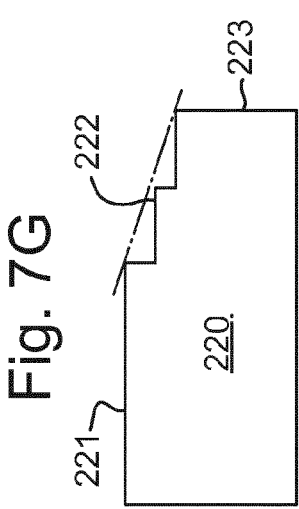

SUBSTRATE HOLDER FOR USE IN A LITHOGRAPHIC APPARATUS

This application is a continuation of U.S. patent application Ser. No. 16/770,464, which was filed on Jun. 5, 2020, now allowed, which is the U.S. national phase entry of PCT/EP2018/082175, which was filed on Nov. 22, 2018, which claims the benefit of priority of European Patent Application No. 18183119.9, which was filed on Jul. 12, 2018, and of European Patent Application No. 17206912.2, which was filed on Dec. 13, 2017, each of which is incorporated herein in its entirety by reference.

FIELD

The present description relates to a substrate holder for use in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In an immersion lithographic apparatus an immersion liquid is interposed in a space between a projection system of the apparatus and a substrate. This immersion liquid can find its way past the edge of the substrate to an under surface of the substrate. This can be deleterious due to contamination of the under surface of the substrate resulting from this immersion liquid and/or due to thermal loads applied to the under surface of the substrate at positions close to the edge of the substrate, due to evaporation of the immersion liquid. A substrate holder which is configured to support the substrate can have features which reduce the quantity and/or distance the immersion liquid moves radially inwardly along the under surface of the substrate.

Generally, a substrate will be supported by the substrate holder whilst the substrate is being irradiated. The substrate holder may comprise specific portions, such as support elements, which contact the underneath of the substrate during use to support the substrate. After the substrate has been irradiated, it may be removed from the substrate holder. There may be specific steps which are carried out to unload the substrate from the substrate holder. The substrate may be deformed during the process of unloading the substrate. The deformity generally causes the centre of the substrate to rise up, away from the substrate holder and causes the substrate to cantilever down, towards the substrate holder over the outermost support beneath the substrate.

During the unloading process, the deformed substrate may contact and wear against different parts of the substrate holder which can lead to various problems. Firstly, the interaction between the support elements of the substrate holders and the underside of the substrate during unloading can lead to wear of the supporting elements. As the supporting elements are used to support the substrate to irradiate further layers, or to support further substrates, any wear of the support elements can lead to focusing and/or overlay issues. The wear of any of the supporting elements may mean that the substrate table needs to be replaced in due course. In other words, the wear of the supporting elements may limit the usable life of the substrate holder. Secondly, the underneath of the substrate tends to contact the features used to reduce the quantity and/or distance that the immerse liquid moves radially inward form an outer edge. This means that the substrate wears down said features and that the features scrape against the underneath of the substrate at an outer edge of the substrate. This can generate particles which contaminate the system and can lead to focusing and/or overlay issues.

SUMMARY

It is an object to provide a substrate holder which reduces the wear on support elements used to support the substrate and/or to reduce damage to an underside of the substrate which can contaminate the system.

In an embodiment, there is provided a substrate holder for use in a lithographic apparatus and configured to support a substrate, the substrate holder comprising: a main body having a main body surface; a plurality of support elements projecting from the main body surface, wherein each support element has a distal end surface configured to support the substrate and a first height; a seal unit comprising a first seal member projecting from the main body surface, the first seal member having an upper surface and a second height less than the first height and being positioned radially outward of and surrounding the plurality of support elements, the upper surface having a contact region configured to contact the substrate during loading and/or unloading of the substrate; and wherein a position of the contact region is arranged at a distance from the plurality of support elements sufficient enough such that during the loading and/or unloading of the substrate, a force applied to the first seal member by the substrate is greater than a force applied to the plurality of support elements by the substrate In an embodiment, there is provided a substrate holder for use in a lithographic apparatus and configured to support a substrate, the substrate holder comprising: a main body having a main body surface; a plurality of support elements projecting from the main body surface, wherein each support element has a distal end surface configured to support the substrate and a first height; a seal unit comprising a first seal member projecting from the main body surface, the first seal member having a second height less than the first height and being positioned radially outward of and surrounding the plurality of support elements, at least one further member projecting from the main body surface and having an upper surface, the at least one further member being positioned radially outward of and surrounding the seal unit, the at least one further member comprising a coating forming the upper surface of the further member, the coating having a contact region configured to contact the substrate during loading and/or unloading of the substrate, wherein the coating is made of diamond-like carbon (e.g. a-CH), diamond, silicon carbide (e.g. SiSiC or SiC), boron nitride, or boron carbon nitride (BCN); and wherein a position of the contact region of the further member is arranged at a distance from the plurality of support elements sufficient enough such that during the loading and/or unloading of the substrate, a force applied to the further member by the substrate is greater than a force applied to the plurality of support elements by the substrate.

In an embodiment, there is provided a substrate holder for use in a lithographic apparatus and configured to support a substrate, the substrate holder comprising: a main body having a main body surface; a plurality of support elements projecting from the main body surface, wherein each support element has a distal end surface configured to support the substrate and a first height; a seal unit comprising a first seal member projecting from the main body surface, the first seal member having an upper surface and a second height less than the first height and being positioned radially outward of the plurality of and surrounding the support elements, and the upper surface having a contact region configured to contact the substrate during loading and/or unloading of the substrate; and wherein a profile of the contact region, in a cross section through the first seal member in a radial direction, has a shape which is configured such that during the loading and/or unloading of the substrate, the substrate contacts the first seal member via at least two different points of the profile.

In an embodiment, there is provided a lithographic apparatus comprising a substrate holder configured to support the substrate.

BRIEF DESCRIPTION OF THE DRAWINGS

Embodiments of the invention will now be described, by way of example only, with reference to the accompanying schematic drawings, in which:

FIGS. 7A-7G each depict, in cross section, a seal unit according to an embodiment of the present invention;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
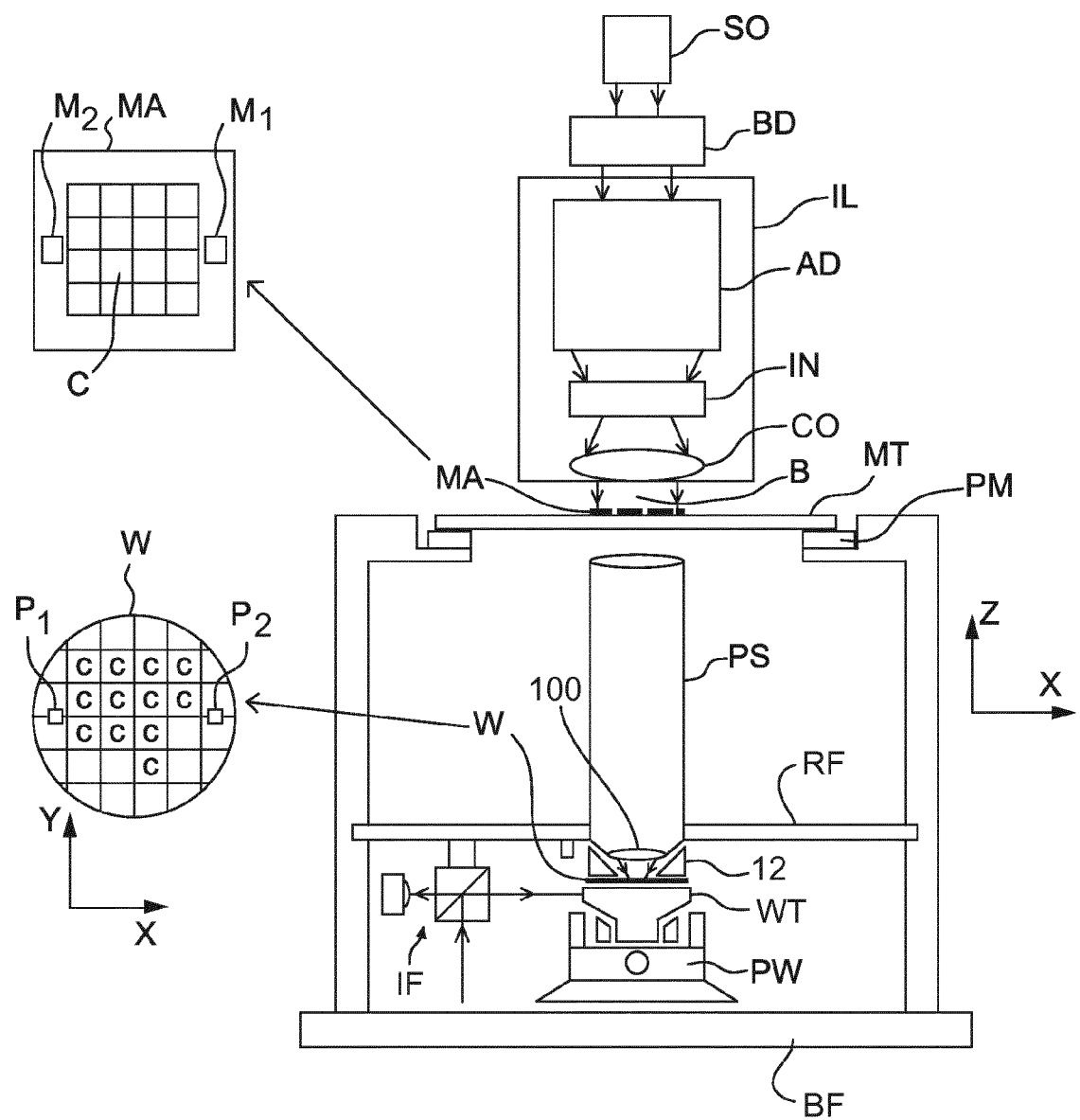
FIG. 1 depicts a schematic overview of a lithographic apparatus.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by an immersion liquid having a relatively high refractive index, e.g., water, so as to fill a space 11 between the projection system PS and the substrate W—which is also referred to as immersion lithography. More information on immersion techniques is given in U.S. Pat. No. 6,952,253, which is incorporated herein by reference.

The lithographic apparatus may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify embodiments of the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify embodiments of the invention. The orientation of the Cartesian coordinate system may be different, for example, such that the z-axis has a component along the horizontal plane.

Immersion techniques have been introduced into lithographic systems to enable improved resolution of smaller features. In an immersion lithographic apparatus, a liquid layer of immersion liquid having a relatively high refractive index is interposed in a space 11 between a projection system of the apparatus (through which the patterned beam is projected towards the substrate W) and the substrate W. The immersion liquid covers at least the part of the substrate under a final element of the projection system PS. Thus, at least the portion of the substrate W undergoing exposure is immersed in the immersion liquid. The effect of the immersion liquid is to enable imaging of smaller features since the exposure radiation will have a shorter wavelength in the liquid than gas. (The effect of the immersion liquid may also be regarded as increasing the effective numerical aperture (NA) of the system and also increasing the depth of focus.)

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space 11 as immersion liquid. Other liquids with a high refractive index can be used besides water can be used as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the space 11 between the final element and a surface facing the final element. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa). A fluid handling structure 12 present between the projection system PS and the substrate support WT is used to confine the immersion liquid to the immersion space 11. The space 11 filled by the immersion liquid is smaller in plan than the top surface of the substrate W and the space 11 remains substantially stationary relative to the projection system PS while the substrate W and substrate support WT move underneath.

Other immersion systems have been envisaged such as an unconfined immersion system (a so-called 'All Wet' immersion system) and a bath immersion system. In an unconfined immersion system, the immersion liquid covers more than the surface under the final element. The liquid outside the immersion space 11 is present as a thin liquid film. The liquid may cover the whole surface of the substrate W or even the substrate W and the substrate support WT co-planar with the substrate W. In a bath type system, the substrate W is fully immersed in a bath of immersion liquid.

The fluid handling structure 12 is a structure which supplies the immersion liquid to the immersion space 11, removes the immersion liquid from the space 11 and thereby confines the immersion liquid to the immersion space 11. It includes features which are a part of a fluid supply system. The arrangement disclosed in PCT patent application publication no. WO 99/49504 is an early fluid handling structure comprising pipes which either supply or recover the immersion liquid from the space 11 and which operate depending on the relative motion of the stage beneath the projection system PS. In more recent designs, the fluid handling structure extends along at least a part of a boundary of the space 11 between the final element of the projection system PS and the substrate support WT or substrate W, so as to in part define the space 11.

The fluid handing structure 12 may have a selection of different functions. Each function may be derived from a corresponding feature that enables the fluid handling structure 12 to achieve that function. The fluid handling structure 12 may be referred to by a number of different terms, each referring to a function, such as barrier member, seal unit, fluid supply system fluid removal system, liquid confinement structure, etc.

As a barrier member, the fluid handling structure 12 is a barrier to the flow of the immersion liquid from the space 11. As a liquid confinement structure, the structure confines the immersion liquid to the space 11. As a seal unit, sealing features of the fluid handling structure form a seal to confine the immersion liquid to the space 11. The sealing features may include an additional gas flow from an opening in the surface of a seal member of the seal unit, such as a gas knife.

In an embodiment the fluid handling structure 12 may supply immersion fluid and therefore be a fluid supply system.

In an embodiment the fluid handling structure 12 may at least partly confine immersion fluid and thereby be a fluid confinement system.

In an embodiment the fluid handling structure 12 may provide a barrier to immersion fluid and thereby be a barrier member, such as a fluid confinement structure.

In an embodiment the fluid handling structure 12 may create or use a flow of gas, for example to help in controlling the flow and/or the position of the immersion fluid.

The flow of gas may form a seal to confine the immersion fluid so the fluid handling structure 12 may be referred to as a seal unit; such a seal unit may be a fluid confinement structure.

In an embodiment, immersion liquid is used as the immersion fluid. In that case the fluid handling structure 12 may be a liquid handling system. In reference to the aforementioned description, reference in this paragraph to a feature defined with respect to fluid may be understood to include a feature defined with respect to liquid.

A lithographic apparatus has a projection system PS. During exposure of a substrate W, the projection system PS projects a beam of patterned radiation onto the substrate W. To reach the substrate W, the path of the radiation beam B passes from the projection system PS through the immersion liquid confined by the fluid handling structure 12 between the projection system PS and the substrate W. The projection system PS has a lens element, the last in the path of the beam, which is in contact with the immersion liquid. This lens element which is in contact with the immersion liquid may be referred to as 'the last lens element' or "the final element". The final element is at least partly surrounded by the fluid handling structure 12. The fluid handling structure 12 may confine the immersion liquid under the final element and above the facing surface.

Figure 2A:
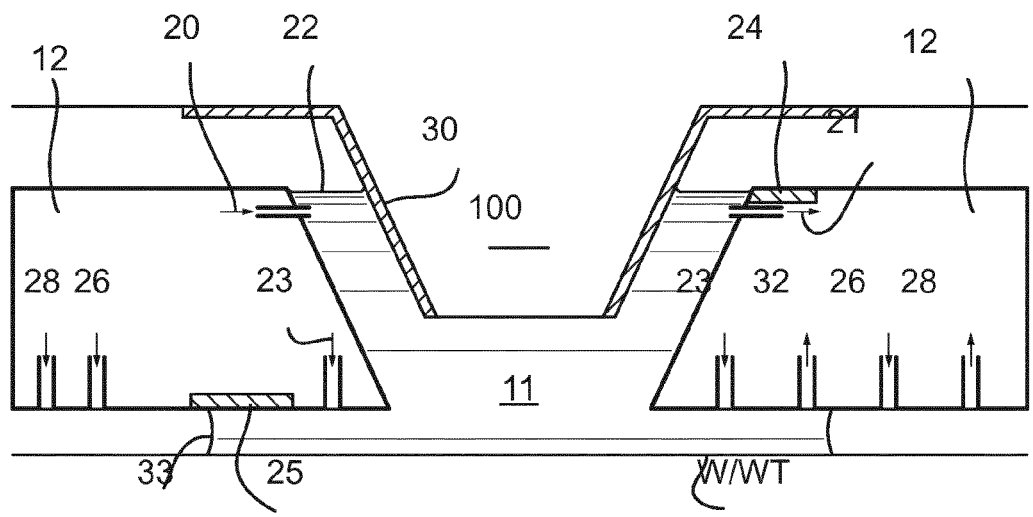
FIGS. 2A and 2B depict, in cross section, two different versions of a fluid handling structure with different features illustrated on the left-hand side and the right-hand side, which may extend around the complete circumference.
Figure 2B:
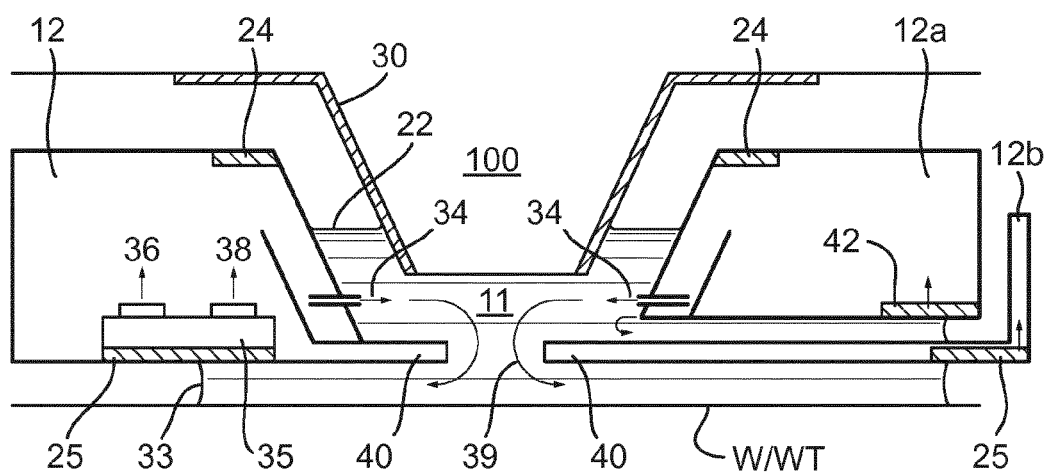

FIGS. 2A and 2B show different features which may be present in variations of fluid handling structure 12. The designs may share some of the same features as FIGS. 2A and 2B unless described differently. The features described herein may be selected individually or in combination as shown or as required.

FIG. 2A shows a fluid handling structure 12 around the bottom surface of a final element 100. The final element 100 has an inverted frusto-conical shape. The frusto-conical shape having a planar bottom surface and a conical surface. The frusto-conical shape protrudes from a planar surface and having a bottom planar surface. The bottom planar surface is the optically active portion of the bottom surface of the final element 100, through which the radiation beam B may pass. The final element 100 may have a coating 30. The fluid handling structure 12 surrounds at least part of the frusto-conical shape. The fluid handling structure 12 has an inner-surface which faces towards the conical surface of the frusto-conical shape. The inner-surface and the conical surface have complementary shape. A top surface of the fluid handling structure 12 is substantially planar. The fluid handling structure 12 may fit around the frusto-conical shape of the final element 100. A bottom surface of the fluid handling structure 12 is substantially planar and in use the bottom surface may be parallel with the facing surface of the substrate support WT and/or substrate W. The distance between the bottom surface and the facing surface may be in the range of 30 to 500 micrometers, desirably in the range of 80 to 200 micrometers.

The fluid handling structure 12 extends closer to the facing surface of the substrate W and substrate support WT than the final element 100. A space 11 is therefore defined between the inner surface of the fluid handling structure 12, the planar surface of the frusto-conical portion and the facing surface. During use, the space 11 is filled with immersion liquid. The immersion liquid fills at least part of a buffer space between the complementary surfaces between the final element 100 and the fluid handling structure 12, in an embodiment at least part of the space between the complementary inner-surface and the conical surface.

The immersion liquid is supplied to the space 11 through an opening formed in a surface of the fluid handling structure 12. The immersion liquid may be supplied through a supply opening 20 in the inner-surface of the fluid handling structure 12. Alternatively or additionally, the immersion liquid is supplied from an under supply opening 23 formed in the undersurface of the fluid handling structure 12. The under supply opening 23 may surround the path of the radiation beam B and it may be formed of a series of openings in an array. The immersion liquid is supplied to fill the space 11 so that flow through the space 11 under the projection system PS is laminar. The supply of the immersion liquid from the under supply opening 23 under the fluid handling structure 12 additionally prevents the ingress of bubbles into the space 11. This supply of the immersion liquid functions as a liquid seal.

The immersion liquid may be recovered from a recovery opening 21 formed in the inner-surface. The recovery of the immersion liquid through the recovery opening 21 may be by application of an under pressure; the recovery through the recovery opening 21 as a consequence of the velocity of the immersion liquid flow through the space 11; or the recovery may be as a consequence of both. The recovery opening 21 may be located on the opposite side of the supply opening 20, when viewed in plan. Additionally or alternatively, the immersion liquid may be recovered through an overflow opening 24 located on the top surface of the fluid handling structure 12. In an embodiment, the supply and recovery openings 20, 21 can have their function swapped (i.e. the flow direction of liquid is reversed). This allows the direction of flow to be changed depending upon the relative motion of the fluid handling structure 12 and substrate W.

Additionally or alternatively, immersion liquid may be recovered from under the fluid handling structure 12 through a recovery opening 25 formed in its bottom surface. The recovery opening 25 may serve to hold (or 'pin') a meniscus 33 of the immersion liquid to the fluid handling structure 12. The meniscus 33 forms between the fluid handling structure 12 and the facing surface and it serves as border between the liquid space and the gaseous external environment. The recovery opening 25 may be a porous plate which may recover the immersion liquid in a single phase flow. The recovery opening in the bottom surface may be a series of pining openings 32 through which the immersion liquid is recovered. The pining openings 32 may recover the immersion liquid in a two phase flow.

Optionally radially outward, with respect to the inner-surface of the fluid handling structure 12, is a gas knife opening 26. Gas may be supplied through the gas knife opening 26 at elevated speed to assist liquid confinement of the immersion liquid in the space 11. The supplied gas may be humidified and it may contain substantially carbon dioxide. Radially outward of the gas knife opening 26 is a gas recovery opening 28 for recovering the gas supplied through the gas knife opening 26. Further openings, for example open to atmosphere or to a gas source, may be present in the bottom surface of the fluid handling structure 12. For example, further openings may be present between gas knife opening 26 and gas recovery opening 28 and/or between pining openings 32 and gas knife opening 26.

Features shown in FIG. 2B which are common to FIG. 2A share the same reference numbers. The fluid handling structure 12 has an inner surface which complements the conical surface of the frusto-conical shape. The undersurface of the fluid handling structure 12 is closer to the facing surface than the bottom planar surface of the frusto-conical shape.

Immersion liquid is supplied to the space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B.

Immersion liquid is recovered from the space 11 through recovery openings 25 in the undersurface of the fluid handling structure 12. As the facing surface moves under the fluid handling structure 12, the meniscus 33 may migrate over the surface of the recovery opening 25 in the same direction as the movement of the facing surface. The recovery openings 25 may be formed of a porous member. The immersion liquid may be recovered in single phase. In an embodiment the immersion liquid is recovered in a two phase flow. The two phase flow is received in a chamber 35 within the fluid handling structure 12 where it is separated into liquid and gas. The liquid and gas are recovered through separate channels 36, 38 from the chamber 35.

An inner periphery 39 of the undersurface of fluid handling structure 12 extends into the space 11 away from the inner surface to form a plate 40. The inner periphery 39 forms a small aperture which may be sized to match the shape and size of the radiation beam B. The plate 40 may serve to isolate the immersion liquid at either side of it. The supplied immersion liquid flows inwards towards the aperture, through the inner aperture and then under the plate 40 radially outwardly towards the surrounding the recovery openings 25.

In an embodiment the fluid handling structure 12 may be in two parts as shown on the right hand side of FIG. 2B: an inner part 12a and an outer part 12b. The inner part 12a and the outer part 12b may move relatively to each other, in a plane parallel to facing surface. The inner part 12a may have the supply openings 34 and it may have the overflow recovery 24. The outer part 12b may have the plate 40 and the recovery opening 25. The inner part 12a may have an intermediate recovery 42 for recovering the immersion liquid which flows between the inner part 12a and the outer part 12b.

In the examples of FIGS. 2A and 2B, at least one of the various recovery openings (e.g. recovery opening 21 in FIG. 2A, overflow recovery 24 in both FIGS. 2A and 2B, recovery opening 25 in both FIGS. 2A and 2B, pining openings 32 in FIG. 2A, and channels 36, 38 in FIG. 2B) and/or supply openings (e.g. supply opening 20 in FIG. 2A, under supply opening 23 in FIG. 2A, and supply openings 34 in FIG. 2B) can be used to control the amount of immersion liquid in the space 11. The location of the meniscus 33 and the location of a meniscus 22, which is similar to meniscus 33 except it is formed between the another part of the fluid handling system 12 and the final element 100, will vary depending on the amount of immersion liquid in the space 11.

Figure 3A:
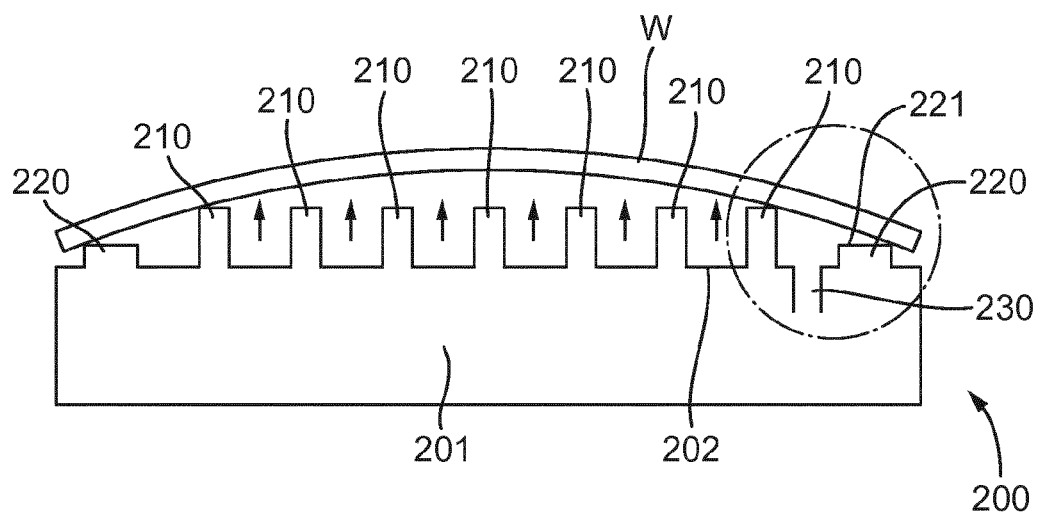
FIG. 3A depicts, in cross section, a substrate holder according to the prior art

The substrate support WT may comprise a substrate holder 200 which is configured to support the substrate W. FIG. 3A illustrates, in cross section, substrate holder 200 and an associated substrate W which is being supported by the substrate holder 200. The substrate holder 200 comprises a main body 201 having a main body surface 202. In use, the main body surface 202 faces an under surface of the substrate W, i.e. a lower surface of the substrate W which faces the substrate holder 200.

In a central region of the main body surface 202, a plurality of support elements 210 project from the main body surface 202. Each support elements 210 has a distal end surface 211 (shown in FIG. 3B) configured to support the substrate W. For example, during irradiation of the substrate W, the support elements 210 may be configured to contact the under surface of the substrate W. The support elements 210 are arranged relative to one another in a pattern, in plan. The pattern is such as to support the substrate W and to reduce any bowing of the substrate W towards the main body surface 202 to an acceptable amount.

The area in plan of each support element 210 is relatively small compared to the area, in plan, of the substrate W. Therefore, the support elements 210 contact only a small area of the under surface of the substrate W. This reduces the opportunity for contamination to be transferred from the substrate holder 200 to the substrate W.

A pressure differential across the substrate W is established. For example, the space between the main body 201 of the substrate holder 200 and the substrate W is connected to an under pressure that is lower than a higher pressure above the substrate W. The pressure difference gives rise to a force holding the substrate W to the substrate holder 200 when in use, e.g. when the substrate W is irradiated. In other words, the substrate holder 200 has means for clamping the substrate W to the substrate holder 200.

In an immersion lithographic apparatus, liquid will, at least at certain times during exposure of the substrate W, be present adjacent to an edge of the substrate W. Due to the under pressure between the main body 201 of the substrate holder 200 and the under surface of the substrate W, this liquid will be drawn in around the edge of the substrate W and under the substrate W. In order to reduce occurrence of liquid being in contact with the under surface of the substrate W and especially at the area where the support elements 210 are in contact with the substrate W, a seal unit comprising at least one member projecting from the main body surface 202 of the main body 201 can be provided. Overall, the liquid between the substrate W and the main body surface 202 radially inward past the seal unit. The seal unit may comprise a first seal member and a second seal member. The first seal member may be radially outwards of and surrounding the second seal member. The first seal member may be used to reduce the pressure in a region between the first seal member and the second seal member. The second seal member may be configured to restrict or prevent the passage of liquid radially inwards of the second seal member. The first seal member may also at least partially restrict passage of liquid radially inward of the first seal member. The seal unit may be configured to restrict passage of the liquid around substantially the entire circumference of the seal unit, i.e. around the whole substrate W. In other words, the amount of liquid at a position radially outward of the seal unit is restricted or prevented from moving radially inward to a position radially inwards of the seal unit due to the presence of the seal unit. This means that the presence of the seal unit reduces the amount of liquid at a position radially inwards of the seal unit compared to if the seal unit is not provided. The liquid may be prevented from simply going around the seal unit.

The seal unit may be part of a seal mechanism, for example a seal formed near or around the radially outer edge of the substrate W. The seal unit may comprise further components used to restrict passage of liquid radially inward.

One purpose of the seal unit is to limit the flow of gas (which may undesirably be humid) radially inward towards the support element 210. This enables the under pressure to be generated around the support elements 210 which is necessary for clamping the substrate W to the substrate holder 200. It is advantageous to allow some flow of gas over the seal unit so that when the under pressure source which generates the under pressure around the support elements 210 is switched off, the substrate W can quickly be removed from the substrate holder 200. If the gas flow is too low past the seal unit, then the time taken for the pressure around the support elements 210 to equalize with the pressure above the substrate W, thereby releasing the substrate W, is too high. The substrate holder 200 may be configured to generate an over pressure beneath the under surface of the substrate W so that the substrate W can be more quickly removed.

Figure 3B:
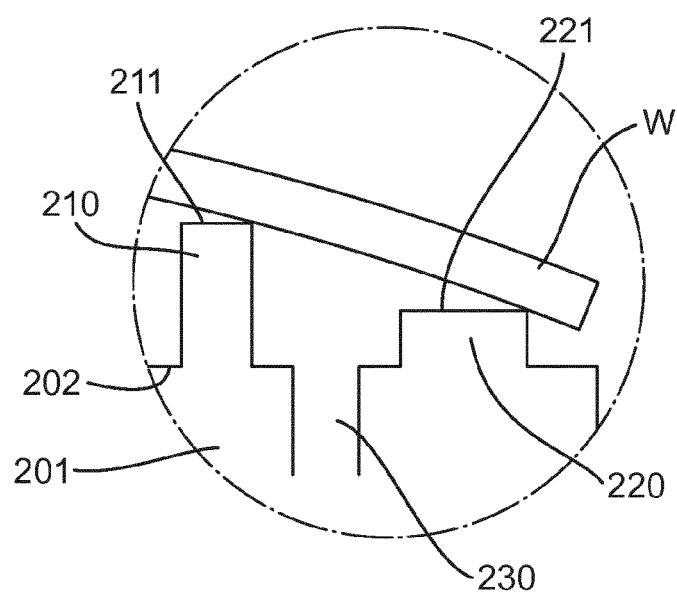
FIG. 3B depicts a close-up portion of FIG. 3A showing an outermost support element and a seal member.

The seal unit may comprise at least one seal member. The seal member may comprise a first seal member 220 and a second seal member 240. The first seal member 220 is shown in FIGS. 3A and 3B. The second seal member 240 will be described below in further detail. The first seal member 220 may be configured to restrict the flow of gas/fluid radially inwards of the first seal member 220. The seal unit may comprise only the first seal member 220, for example, in a dry lithographic system.

The first seal member 220 has an upper surface 221 which is a distal end of the first seal member 220. Thus, the upper surface 221 is situated away from the point of contact between the first seal member 220 and the main body surface 202 (even if the first seal member 220 and the main body 201 are integral with one another). The upper surface 221 is configured, in use, to form a gap between the upper surface 221 and the under surface of the substrate W. That is, the upper surface 221 is configured to be somewhat closer to the main body surface 202 than the distal end surface 211 of the support elements 210. This is advantageous because this arrangement allows gas to be drawn in over the first seal member 220 (under the substrate W) just before the substrate W removal whilst allowing restriction of the passage of liquid in the same direction. This is achieved without contacting a large area of the under surface of the substrate W which would lead deleteriously to transfer of contamination from the first seal member 220 to the substrate W. This would also make removal of the substrate W from the substrate holder 200 more problematic.

As can be seen in FIGS. 3A and 3B, the most radially outward of the plurality of support elements 210 is somewhat distant from the edge of the substrate W. In the absence of any other feature supporting the substrate W radially outward of the most radially outward support elements 210, bending of the edge of the substrate W downwards may occur, in particular, during unloading of the substrate W. This is due to the under pressure underneath the substrate W compared to above the substrate W.

In use, an under pressure in a central region of the substrate holder 200 between the main body surface 202 and the substrate W can be provided. This under pressure is the reason why the substrate W may be clamped to the substrate holder 200 during use. This clamping under pressure may have a lower magnitude (i.e. a less severe vacuum) then the under pressure at a region radially outward of the support elements 210.

During unloading of the substrate W, the pressure can be controlled between the main body surface 202 and the substrate W to allow unloading of the substrate W. The unloading of the substrate W may include steps of increasing the pressure between the main body surface 202 and the substrate W. This is indicated by the upward arrows in FIG. 3A. For example, when the substrate W is to be unloaded, the vacuum under the substrate W can be removed by injecting high pressure air under the substrate W. Thus, the unloading of the substrate W includes at least one release step, for example, increasing the pressure between the main body 201 and the under surface of the substrate W. An advantage of creating an over pressure under the substrate W during unloading is that any fluid between the substrate W and the main body surface 202 will be pushed radially outward. However, this generally leads to an over pressure under the center of the substrate W and an under pressure around the edge of the substrate W. Thus, the substrate W may deform and bulge up in the middle of the substrate W and cantilever downwards at the edge of the substrate W.

FIGS. 3A and 3B are indicative of the prior art and show that whilst the substrate W is bulging up in the middle, the sides of the substrate W will scrape over the radially outermost support element 210 and the first seal member 220. As shown in the close up in FIG. 3B, there is interaction between the distal end surface 211 of the radially outermost support element 210 and the substrate W, and also between the upper surface 221 of the first seal member 220 and the substrate W. As indicated above, this can have deleterious effects on the system.

The scraping of the substrate W over the distal end surface 211 of the support element 210 applies a force to the support element 210. Any interaction between the substrate W and one of the support elements 210 can lead to wear on the support element 210. This is an issue because it can alter the exact height of the support elements 210. If the height of the support elements 210 is changed, this can lead to focusing and/or overlay issues when irradiating further substrates W and/or further layers of the same substrate W. If the support elements 210 become too damaged, it may be necessary to replace the substrate holder 200. Therefore, preventing damage of the support element 210 provides more stable long term performance of the substrate holder 200.

Interaction between the substrate W and the first seal member 220 occurs as the underside of the substrate W scrapes over an edge of the first seal member 220, i.e. in known systems, the under surface of the substrate W contacts the first seal member 220 via a single point contact (in cross-section) during unloading. This leads to high stress points on the under surface of the substrate W and causes scratches on the under surface of the substrate W. The scratches can generate particles of substrate W, or even first seal member 220, which contaminate the system. The particles are generally close to the edge of the substrate W and could therefore end up on top of the substrate W. Additionally, the interaction may lead to wear of the first seal member 220 in an undesirable manner, i.e. in a way which affects the capability of the first seal member 220 (and thus the seal unit as a whole) to function as desired. Thus, it is desirable to reduce interaction between the first seal member 220 and the substrate W in a way which might affect the ability of the first seal member 220 to control the pressure between the first seal member 220 and the second seal member 240 and/or to control inward movement of liquid past the first seal member 220. Therefore, preventing damage of the first seal member 220 in certain areas used to provide the seal provides more stable long term performance of the substrate holder 200.

Wear is deleterious because it can result in contamination of the substrate W as well as a change in the clamping characteristics of the substrate holder 200 and thereby deformation of the substrate W. The presence of liquid between the support elements 210 and the substrate W underside can also lead to wear (if the substrate holder 200 is a ceramic), and possibly friction variation. Deformation of the substrate W can lead to imaging errors (e.g. overlay errors and/or focusing errors), as can contamination. The presence of liquid on the underside of the substrate W is generally deleterious because this can result in thermal stability issues of the substrate W or difficulties when the liquid droplets are lost during unloading of the substrate W.

Similar issues may arise during loading of the substrate W on the substrate holder 200. Thus, during loading, the substrate W may be deformed in some way which leads to the scraping of the substrate W against the substrate holder 200 as described above. Additionally or alternatively, during loading of a substrate W in a dry lithographic apparatus, the substrate W may be tilted during loading and this may cause the edge of the substrate W to contact the edge of the support elements 210 causing wear.

As will be described below, the substrate holder 200 of an embodiment of the present invention alleviates some of these difficulties due to the location and shape of the first seal member 220 which is configured to interact with the substrate W during unloading (or loading) of the substrate W and whilst still providing a mechanism as part of the seal unit, e.g. by restricting passage of fluid/gas radially inward of the first seal member 220. The unloading step can otherwise be referred to as a release step and thus, the term release can be interchanged in the parts of the description below relating to unloading of the substrate W.

In an embodiment, a substrate holder 200 as described in FIGS. 3A and 3B is provided. However, the first seal member 220 is configured to address some of the above described issues. The differences between an embodiment of the present invention and at least the first seal member 220 described above in relation to FIGS. 3A and 3B will be described in detail below.

In further detail, an embodiment provides a substrate holder 200 for use in lithographic apparatus and configured to support a substrate W. The substrate holder 200 comprises a main body 201 having a main body surface 202. The substrate holder 200 also comprises a plurality of support elements 210 projecting from the main body surface 202, wherein each support elements 210 has a distal end surface 211 configured to support the substrate W. The support elements 210 may have a first height. The substrate holder 200 further comprises a seal unit. The seal unit may be configured to restrict the passage of liquid between the substrate W and the main body surface 202 radially inward past the seal unit. The seal unit may comprise a first seal member 220 projecting from the main body surface 202 and having an upper surface 221. The first seal member 220 may have a second height, the second height being less than the first height. Thus, the support elements 210 may be taller than the first seal member 220. Similarly, the support elements 210 may be taller than the second seal member 240 (if provided). The seal unit may comprise a second seal member 240 projecting from the main body surface 202. The second seal member 240 may be positioned radially inwards of the first seal member 220. The first seal member 220 may be positioned radially outward of and surrounding the plurality of support elements 210. The second seal member 240 is optional and may be particularly useful for immersion systems in order to prevent passage of liquid radially inwards.

The first seal member 220 and the second seal member 240 may together be configured to restrict or prevent liquid and gas from passing radially inwards of the seal unit. The first seal member 220 may be configured to create a low pressure region between the first seal member 220 and the second seal member 240. Thus, the pressure of a space between the first seal member 220 and the second seal member 240, i.e., seal area, may be lower than the pressure surrounding the seal unit. The low pressure region between the first seal member 220 and the second seal member 240 reduces the amount of liquid moving radially inwards of the space between the first seal member 220 and the second seal member 240.

The first seal member 220 may be configured to provide a pressure drop radially inwards of the first seal member 220 relative to the pressure in a region radially outwards of the seal unit. For example, the first seal member 220 may be used primarily to create a pressure drop from ambient to approximately −500 mbar and, thus, to create a vacuum to clamp the substrate W. The second seal member 240 may be used to maintain a pressure difference of approximately 25 mbar between the seal area and the inner portion of the substrate holder 200, which may be at −475 mbar for example. This small pressure difference may result in a body of water (capillary) in a small gap between the second seal member 240 and the substrate W. The main function of second seal member 240 may be the restriction of water moving further inwards. The second seal member 240 may be configured to reduce or prevent liquid from passing radially inwards of the seal unit.

The cross-sectional area of the first seal member 220 in plan, may be very much greater than that of the support elements 210. The relatively large area, in plan, of the first seal member 220 results in a greater resistance to the passage of the liquid between the substrate W and the main body surface 202 radially inward past the first seal member 220. The cross-sectional shape of the first seal member 220 in plan may be circular, or more specifically ring-shaped or annular shaped. Thus, the first seal member 220 may have an annular shape.

The cross-sectional area of the second seal member 240 in plan, may be very much greater than that of the support elements 210. The relatively large area, in plan, of the second seal member 240 results in a greater resistance to the passage of the liquid between the substrate W and the main body surface 202 radially inward past the second seal member 240. The first seal member 220 and the second seal member 240 may have similar or the same cross-sectional areas. The cross-sectional shape of the second seal member 240 in plan may be circular, or more specifically ring-shaped or annular shaped. Thus, the second seal member 240 may have an annular shape.

The first seal member 220 may surround the plurality of support elements 210. Thus, the first seal member 220 may be substantially around the whole circumference of the plurality of the support elements 210. In other words, the first seal member 220 may enclose the plurality of support elements 210, for example, when viewed in plan. The first seal member 220 may be a continuous (though not necessarily uniform in cross-section) barrier surrounding the support elements 210. Alternatively, the first seal member 220 may be formed of a plurality of segments. The plurality of segments may form substantially all of an annular ring. In other words, the first seal member 220 may be formed by multiple separate segments which substantially form an annular ring. In the segmented annular ring, there may be multiple seal member portions with a gap between each neighboring seal member portion. The gap between neighboring seal member portions may be the same length or shorter than the length of either or both of the neighboring portions. The distance between each seal member portion may be the same as, or less than, the width of one or both of the neighboring seal member portions. At least one of the gaps between neighboring seal member portions, i.e. the spacing between neighboring portions, may be in the order of tens or hundreds of microns. At least one of the gaps between neighboring seal member portions may be as narrow as approximately 10 microns. At least one of the gaps may be between 0.5-5 mm. Some or all of the gaps may have these dimensions. Providing small gaps may be advantageous is that any contamination, for example from interaction between the first seal member 220 and the underside of the substrate W can be caught in the gaps whilst still providing a relatively large contact area on the first seal member 220.

The second seal member 240 may be positioned radially inward of the first seal member 220. The second seal member 240 may be radially outward of some or all of the plurality of support elements 210. Some of the plurality of support elements 210 may be provided radially outward of the second seal member 240. Thus, some of the plurality of support elements 210 may be provided between the first seal member 220 and the second seal member 240. This is described in further detail in relation to FIG. 10 below.

The second seal member 240 may surround at least some, if not most, of the plurality of support elements 210. Thus, the second seal member 240 may be substantially around the whole circumference of at least some, if not most, of the plurality of the support elements 210. In other words, the second seal member 240 may enclose at least some, if not most, of the plurality of support elements 210, for example, when viewed in plan. The second seal member 240 may be a continuous (though not necessarily uniform in cross-section) barrier surrounding the support elements 210. Alternatively, the second seal member 240 may be formed of a plurality of segments. The plurality of segments may form substantially all of an annular ring. In other words, the second seal member 240 may be formed by multiple separate segments which substantially form an annular ring. In the segmented annular ring, there may be multiple seal member portions with a gap between each neighboring seal member portion. The gap between neighboring seal member portions may be the same length or shorter than the length of either or both of the neighboring portions. The distance between each seal member portion may be the same as, or less than, the width of one or both of the neighboring seal member portions. At least one of the gaps between neighboring seal member portions, i.e. the spacing between neighboring portions, may be in the order of tens or hundreds of microns. At least one of the gaps between neighboring seal member portions may be as narrow as approximately 10 microns. At least one of the gaps may be between 0.5-5 mm. Some or all of the gaps may have these dimensions. Providing small gaps may be advantageous is that any contamination, for example from interaction between the first seal member 220 and the underside of the substrate W can be caught in the gaps.

The upper surface 221 of the first seal member 220 has contact region 222 configured to contact the substrate W during unloading of the substrate W. The upper surface 221 of the first seal member 220 is configured so that it does not contact the substrate W when the substrate W is being irradiated, i.e. the first seal member 220 is not used to support the substrate W during irradiation. The contact region 222 is configured so that it does not contact the substrate W when the substrate W is being irradiated, i.e. the contact region 222 is not used to support the substrate W during irradiation. The contact region 222 may be configured to only contact the substrate W during the unloading of the substrate W. In previously known systems, it was not intended that the upper surface of any seal member provided would contact the substrate W during unloading (or loading) of the substrate W. Furthermore, in previously known systems, there may not have been any contact between the seal member and the substrate during loading or unloading, thus all the wear may have occurred on the support elements 210.

In an embodiment, a position of the contact region 222 may be arranged at a distance from the plurality of support elements 210 sufficient enough such that during the unloading of the substrate W, a force applied to the first seal member 220 by the substrate W is greater than a force applied to the plurality of support elements 210 by the substrate W. This means that during unloading of the substrate W, wear of the support elements 210 is less than wear of the first seal member 220. This means wear of the support elements 210 can be reduced compared to wear of the first seal member 220 when releasing a substrate using the configuration shown in FIGS. 3A and 3B. Ideally, the first seal member 220 may be the main feature in contact with the substrate W during unloading, i.e. ideally, at certain points during unloading, the substrate W is only in contact with the contact region 222 and not the support elements 210.

Figure 4:
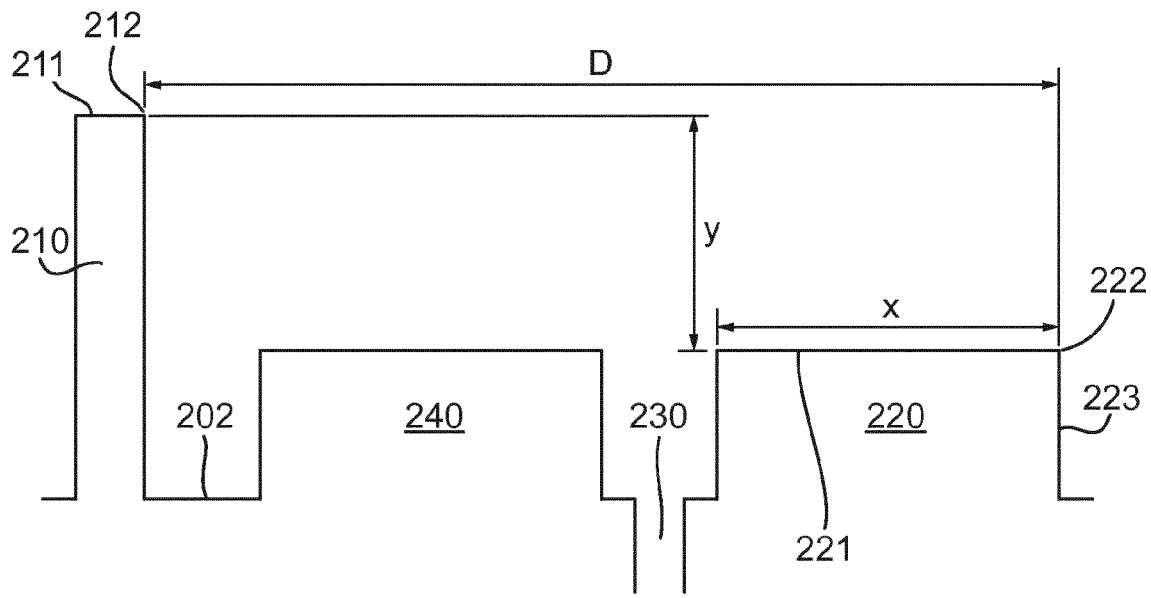
FIG. 4 depicts, in cross section, an edge of a substrate holder according to an embodiment of the present invention.

In other words, the point and/or region of the first seal member 220 which is configured to contact the substrate W during unloading of the substrate W is far enough away from the support element 210 that the wear on the radially outermost support element 210 is less than the wear on the first seal member 220. For example, if the first seal member 220 is formed with a uniform cross-section around the circumference, e.g. as shown in FIG. 4, the cross-section shows a single point contact, but this will be provided around the circumference of the first seal member 220 and the contact region 222 will be provided by the area around the entire first seal member 220.

The contact region 222 may simply be the region of the first seal member 220 configured to contact the substrate W at some point during the unload process. This will generally be a known, defined area. For example, in FIG. 4, the contact region 222 is shown as the radially outermost point on the upper surface 221 of the first seal member 220. The contact region 222 may be positioned point between the upper surface 221 of the first seal member 220 and a radially outer edge 223 of the first seal member 220. In other words, the contact region 222 may provide a region between the upper surface 221 and the radially outer edge 223. Thus, the contact region 222 may form a connection between the upper surface 221 and the radially outer edge 223. This may be a point at which the upper surface 221 and the radially outer edge 223 would otherwise meet, as in FIG. 4. Alternatively, the contact region 222 may be an area between these two surfaces, for example, as in FIG. 6A. There may be a change in gradient between the upper surface 221 and the contact region 222. There may be a change in gradient between the surface of the radially outer edge 223 and the contact region 222.

The contact region 222 may not be uniform around the first seal member 220 and may be configured to provide an increased contact area in certain positions where it is known that particle contamination is greater.

It is known that the first seal member 220 should be provided within a certain distance of the radially outermost support element 210 in order to maintain the desired pressure between the substrate W and the main body 201. Thus, an embodiment of the present invention teaches away from this by providing a certain distance between contact region 222 and the radially outer edge of the most radially outer support element 210 whilst still maintaining the required pressure.

The position of the contact region 222 relative to the support elements 210 may be controlled in various different ways. For example, as shown in FIG. 4, the main dimensions relate to the distance between a radially outer edge 212 of distal end surface 211 of the radially outermost support elements 210 and an outer upper edge of the upper surface 221 of the first seal member 220. The dimensions relate to these specific parts of the support element 210 and the first seal member 220 because these are the parts of these components which will come into contact with the under surface of the substrate W during unloading of the substrate W.

The distance may be defined by a distance D in the radial direction. The distance may be additionally or alternatively defined by the distance y between the distal end surface 211 of the support element 210 and the upper surface 221 of the first seal member 220. Both of these distances will affect how the substrate W interacts with each of these components during unloading.

In this example, the contact region 222 is shown as an edge contact point in the cross section. Thus, in this embodiment, the contact region 222 is formed by the same contact point around the circumference of the first seal member 220. This contact region 222 would be the same in FIG. 4 as in the examples shown in FIGS. 3A and 3B. However, the position of the contact region 222 in an embodiment with respect to the support element 210 would be different to the relative position of the contact region of the prior art, and would be configured to reduce the wear of the support element 210 during unloading of the substrate W.

In an embodiment the radial distance D from a radially outer edge 212 of the distal end surface 211 to the contact region 222 is greater than 1,000 microns, and preferably greater than 1,500 microns. This means that the contract region 222 can be far enough away from the support element 210 to reduce contact between the support elements 210 and the substrate W during loading and/or unloading. Additionally or alternatively, the difference in height between radially outermost support element 210 and the first seal member 220, shown by y in FIG. 4, is between approximately 2 microns and 8 microns. The difference in height between the radially outermost support element 210 and the first seal member 220 is the distance between the distal end surface 211 and the upper surface 221 of the first seal member 220 in a y direction, wherein the y direction is orthogonal to a plane including the radial direction. Having a difference in height can also reduce contact between the support elements 210 and the substrate W during loading and/or unloading.

Providing the contact region 222 at such a distance means that during loading and/or unloading of the substrate, the substrate W will have greater interaction with the first seal member 220 rather than the radially outermost support elements 210. Effectively, this means that the first seal member 220 is used as a sacrificial wear area. This can lead to significant reduction in the wear of the outermost support elements 210. The distance between the radially outer edge 212 and the contact region 222 can be optimized in the radial direction and/or the y direction to minimize friction between the outermost support elements 210 and the substrate W during loading and/or unloading the substrate W. The optimum values for the distance D and the distance y may vary depending on the substrate holder 200 and/or the substrate W and/or the applications being applied to the substrate W.

The length x of the first seal member 220 in a radial direction may be greater than 300 microns, or preferably, greater than 500 microns. This may be beneficial because the contact region 222 of the first seal member 220 may be gradually worn down by the interaction between the substrate W and the first seal member 220 during unloading. If the first seal member 220 is long enough in the radial direction (i.e. x), the wear of the first seal member 220 will be less likely to affect the capability of the first seal member 220 to carry out the function of restricting the passage of liquid radially inward of the first seal member 220. Thus, providing the first seal member 220 of sufficient length, e.g. greater than 300 microns, or preferably greater than 500 microns may mean that the first seal member 220 is configured to better control liquid at the edge of the substrate holder 200 for a longer period of time than known seal members because the first seal member 220 of an embodiment would not be worn down by the interaction with the substrate W in the same way.

Optionally, the substrate holder 200 may comprise a coating. The coating may be used to cover at least a portion of the substrate holder 200. For example, as described below, the coating may form part of the first seal member 220 and/or part of the at least one of the plurality of support elements 210. The coating may be made of diamond-like carbon (DLC, e.g. a-CH), diamond, silicon carbide (e.g. SiSiC or SiC), boron nitride (BN) or boron carbon nitride (BCN). The coating may be substantially or entirely made from these materials and/or any derivatives of these materials. These materials may be particularly beneficial due to the combination of hardness and Young's modulus. Thus, these materials may have a desired level of toughness (hardness/Young's modulus).

The coating may be a thin layer e.g. having a thickness as described below. The coating may be used to cover the surface of various portions of the substrate holder 200. The coating may be substantially uniform over any one portion of the substrate holder 200 comprising the coating. For example, the coating may be provided as a layer of substantially uniform thickness over the first seal member 220 and/or the at least one plurality of support elements 210. For example, the thickness of the coating may vary by less than 50% of the thickness of the coating in the thickest part of the coating in any one portion. Preferably, the thickness varies by less than or equal to 30%, or more preferably by less than or equal to 20%.

The coating may be beneficial in reducing the wear of the substrate holder 200 and/or the scratching of the substrate W on any parts of the substrate holder 200 which come into contact with the substrate, for example, during loading or unloading of the substrate W. The coating may be advantageous in improving the wear resistance of the feature which is coated. This can prevent the feature which has the coating from wearing out.

The coating may be a thin layer. More specifically, the coating may have a thickness between approximately 0.2 μm and 2 μm. Preferably, the thickness of the coating is between approximately 0.2 μm to 1.5 μm. Preferably, the thickness of the coating is between approximately 0.2 μm to 1 μm. More generally, preferably the thickness is less than or equal to 2 μm, or preferably less than or equal to 1.5 μm, or preferably less than or equal to 1 μm. The thickness referred to here may be the average thickness over a specific portion of the substrate holder 200.

Figure 5:
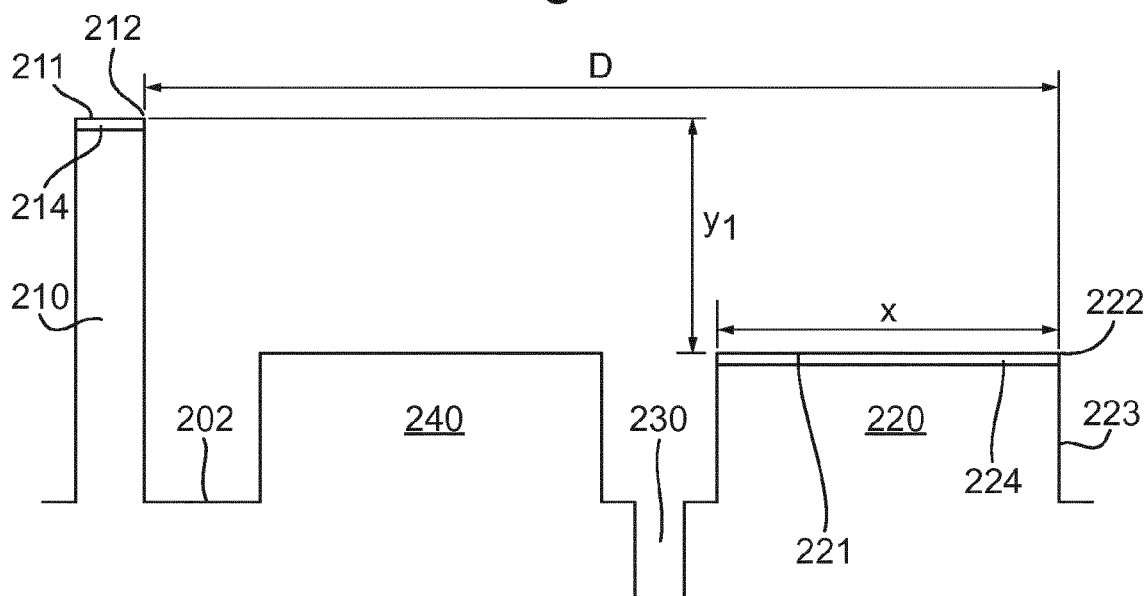
FIG. 5 depicts, in cross section, an edge of a substrate holder according to an embodiment of the present invention.

As shown in FIG. 5, the at least one of the plurality of support elements 210 may comprise a coating 214. The coating 214 may have the characteristics described above. As shown in FIG. 5, the coating 214 may form the distal end surface 211 of the at least one of the plurality of support elements 210. In other words, the coating 214 may be provided on a distal end of a protrusion forming the at least one of the plurality of support elements 210. The coating 214 may provide a layer of protection on the distal end of the at least one of the plurality of support elements 210. As shown in FIG. 5, the coating 214 may be provided on a single one of the plurality of support elements 210, or multiple of the plurality of support elements 210, optionally, all of the plurality of support elements 210.

The coating 214 of at least one of the plurality of support elements 210 may otherwise be referred to as a support member coating. As already described, the coating 214 may reduce wear of the at least one support element 210. It is beneficial to reduce wear of the at least one support element 210 because this can increase the usable life of the substrate holder 200 so that it can be used to process more substrates.

Additionally, as shown in FIG. 5, the first seal member 220 may comprise a coating 224. The coating 224 may have the characteristics described above. As shown in FIG. 5, the coating 224 may form the upper surface 221 of the first seal member 220. In other words, the coating 224 may be provided on a distal end of a protrusion forming the first seal member 220. The coating 224 may provide a layer of protection on the end of the first seal member 220. When the coating 224 is provided on the first seal member 220, the contact region 222 of the first seal member 220 may be on the coating 224. The coating 224 on the first seal member 220 may otherwise be referred to as a seal member coating.

The coating 224 may reduce wear of the first seal member 220. It is beneficial to reduce wear of the first seal member 220 because this means that the first seal member 220 may continue to function as a seal more efficiently for a larger number of substrates W being processed than if no coating is provided. Additionally, if the first seal member 220 is worn down, then the substrate W may contact the at least one support element 210 during loading and unloading, which may reduce the useful life of the substrate holder 200. Thus, it is beneficial to prevent wear of the first seal member 220 to protect the at least one support element 210 for as long as possible/for processing of as many substrates as possible.

As shown in FIG. 5, the coating 214 may be provided on the at least one of the plurality of support elements 210 and the coating 224 on the first seal member 220. However, it is not necessary to provide multiple portions of the substrate holder 200 with a coating. Thus, for example, a coating may only be provided on one or the other, i.e. either the first seal member 220, or at least one of the plurality of support elements 210.

Figure 6A:
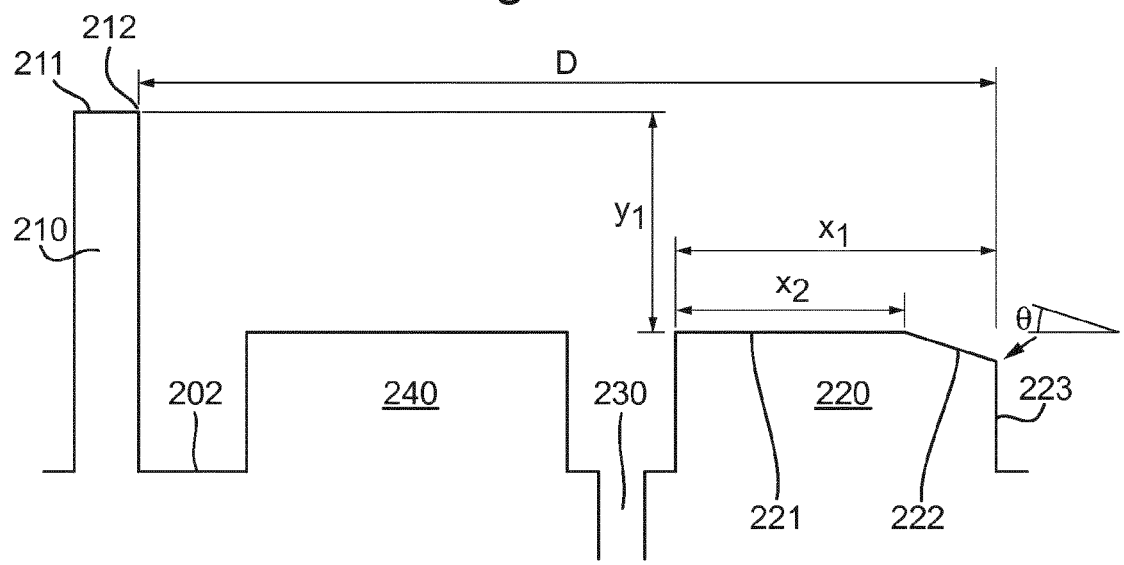
FIGS. 6A and 6B depict, in cross section, an edge of a substrate holder according to an embodiment of the present invention.

Although the above features may reduce the wear on the outermost support element 210, this could be improved by changing the shape of the contact region 222. Additionally or alternatively to the above features, the contact region 222 of the first seal member 220 may be provided with a specific geometry. For example, a profile of the contact region 222, in a cross section through the first seal member 220 in a radial direction, may have a shape which is configured such that during the unloading of the substrate W, the substrate W contacts the seal first member 220 via at least two different points of the profile. An example of the contact region 222 which is configured such that the substrate W contacts the first seal member 220 via at least two different points during unloading is shown in FIG. 6A.

The profile of the contact region 222 being shaped in such a way means that either the substrate W comes into contact with an area rather than a single point in the cross section through the first seal member 220 (as was shown in FIGS. 3A, 3B and 4). Additionally or alternatively, the substrate W may interact with the contact region 222 via various different points, for example the contact point may change during unloading of the substrate W, as will be described in some of the examples below.

Having the substrate W contact the first seal member 220 via at least two different points on the profile is beneficial because the local stresses on the first seal member 220 can be reduced. This is because there is an increased area of contact between the substrate W and the first seal member 220 and/or force from the substrate W is applied to different points of the first seal member 220 during the loading and/or unloading process. Although different geometries may be provided, the different geometries provide a contact between the substrate W and the first seal member 220 at multiple points which spreads the force and reduces the local stresses. Thus, this reduces the forces acting on the underneath side of the substrate W. In turn, this reduces the formation of scratches on the under surface of the substrate W which might produce particles which contaminate the system. Thus, providing such a contact region 222 can be beneficial in reducing contamination.

Various different geometries of the profile may be provided. For example the profile may be linear from the upper surface 221 of the first seal member 220 to the radially outer edge 223 of the first seal member 220. This is shown in FIG. 6A, in which the contact region 222 is formed by a sloped portion having an angle θ. In other words, the first seal member 220 may have a chamfered edge forming the contact region 222. The linear profile from the upper surface 221 of the first seal member 220 to the radially outer edge 223 of the first seal member 220 may be at a negative gradient between approximately 0.15 microns per millimeter to 3 microns per millimeter relative to the upper surface 221 of the first seal member 220.

As with the first seal member 220 depicted in FIG. 4, the distance between the contact region 222 and the support element 210 may be defined by a distance D in the radial direction shown in FIG. 6A. The distance may additionally or alternatively be defined by the distance y1 between the distal end surface 211 of the support element 210 and the upper surface 221 of the first seal member 220. This may be the same as the distance y referred to in FIG. 4 and described above. Both of these distances will affect how the substrate W interacts with each of these components during unloading.

The distance x1 may be within the range defined above for x. The distance x is the full length of the first seal member 220. Additionally or alternatively, the distance x2 may be within the range defined above for x. The distance x2 is the length of the upper surface 221 of the first seal member 220 in the radial direction. In other words, the distance x2 is the length of the first seal member 220 minus the length of the contact region 222 in the radial direction. It may be beneficial for x2 to be above a certain value. The upper surface 221 provides the function of restricting gas/fluid radially inwards of the first seal member 220 and/or providing a low pressure region between the first seal member 220 and the second seal member 240 and/or providing a pressure drop radially inwards of the first seal member 220, Therefore, the part of the upper surface 211 (having length x2) should be long enough such that the first seal member 220 can provide this function.

Figure 6B:
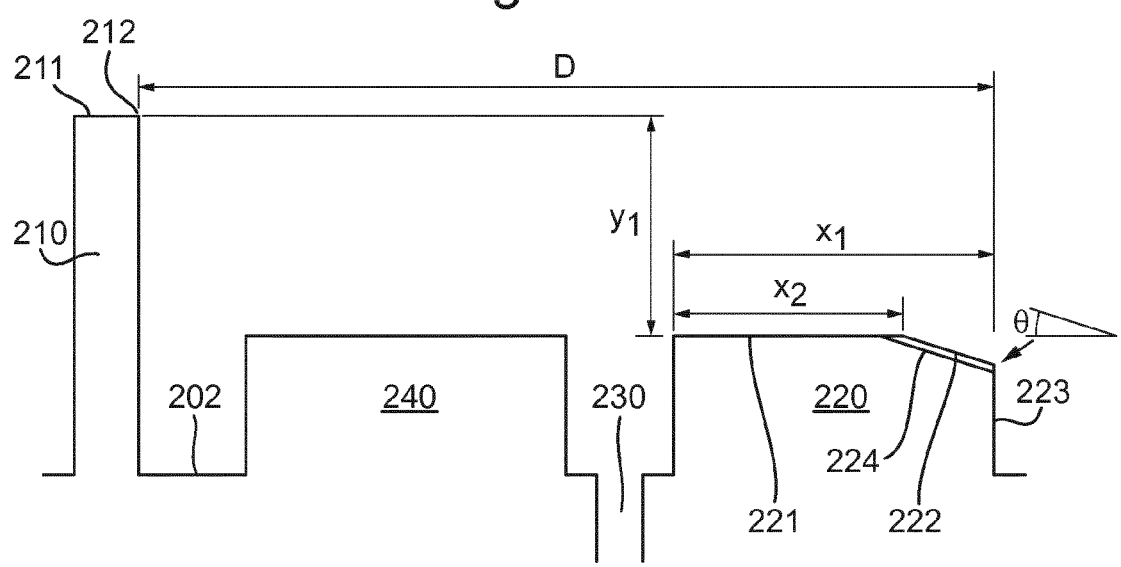

As described above, the coating 224 may be provided on the upper surface of the first seal member 220. As shown in FIG. 6B, the coating 224 may only be provided on the contact region 222, where it may have the greatest effect. Thus, the coating 224 may be formed as part of the first seal member 220 and may form the contact region 222 as described above and below.

In an embodiment, the profile may comprise multiple linear portions from an upper surface 221 of the first seal member 220 to a radially outer edge 223 of the first seal member 220. This is shown in FIGS. 7A, 7B and 7C. In an embodiment, the shape of the profile may be curved from an upper surface 221 of the first seal member 220 to a radially outer edge 223 of the first seal member 220. This is shown in FIGS. 7D, 7E and 7F. Additionally or alternatively, the outer edge of the first seal member 220 may be rounded. This could be a rounded chamfer on an outer edge which forms the contact region 222. The shape of the profile may be part of an ellipse or circle. For example, the shape of the profile may be part of the elliptical circle as depicted in FIG. 7D. The shape of the profile may be essentially step-shaped as shown in FIGS. 7F and 7G. Any of the shapes which provide multiple contact points will decrease local stress on the substrate W compared to a single point contact in cross-section. The substrate W may contact the contact region 222 via a line contact, e.g. when the edge is curved, there is more than a single point in contact between the substrate W and the first seal member 220 such that a line of contact would be seen in the cross-section. The shapes with multiple discrete contact points, rather than a line contact will generally have a smaller overall contact area and will wear faster. The shapes shown in FIGS. 7A-7G are examples of shapes which may be particularly advantageous with specific substrates and/or systems and/or substrate unload settings/sequences. Some of these shapes may have improved manufacturability and/or may have improved effects on properties of used substrates W, such as reducing warpage of the substrates W.

It is beneficial to make the surface of the contact region 222 as smooth as possible. This reduces local stresses on the under surface of the substrate W. Thus, the contact region 222 may be configured to reduce frictional forces between the substrate W and the first seal member 220 when they interact. For example, the contact region 222 may be polished.

The various different profiles shown in FIGS. 6A and 7A-7G mean that the contact region 222 can provide an area of contact between the substrate W and the first seal member 220. This is beneficial because it distributes to force applied to the first seal member 220 and the substrate W and means that local stresses are reduced to reduce or prevent the formation of scratches on an under surface of the substrate W, i.e. to reduce or prevent damage to the under surface of the substrate W. The area of contact can be provided by multiple discrete contact points or the line contact in cross-section.

Although not depicted in the various different profiles shown in FIGS. 7A-7G, any of seal members having these profiles may have a coating 224 as described above.

The first seal member 220 being configured to surround and be positioned radially outward of the plurality of support elements 210 means that all of the support elements 210 are radially inward of the first seal member 220 in plan. Thus, the first seal member 220 can form an outermost point of contact with the under surface of the substrate W during loading and/or unloading. This allows the wear on the support elements 210 to be reduced as described above. The first seal member 220 may surround the support elements 210 as a discrete member around all of the support elements 210 in plan, for example, the first seal member 220 may be circular in plan. The first seal member 220 may not have a uniform cross-section and therefore, the shape of the first seal member 220 as shown in FIG. 4-6, 7A-7G, 8 or 9 may vary. The first seal member 220 may optionally have gaps, such that the first seal member 220 may be provided by multiple discrete members around all of the support elements 210.

Due to the liquid near this part of the system, it is possible that the space between the under surface of the substrate W and the main body 201 of the substrate holder 200 may have a humid atmosphere. The disadvantage of a humid atmosphere is the possibility of oxidation of the support elements 210. Oxidation of the support elements 210 is deleterious as this reduces the achievable flatness of the substrate W supported by the support elements 210. The substrate holder 200 may comprise at least one extraction opening 230 formed in the main body 201 for the extraction of fluid into the main body 201 from between the main body surface 202 and the substrate W. The at least one extraction opening 230 may be part of the seal mechanism. Extraction openings 230 can be provided as described below to help avoid having a humid atmosphere between the main body surface 202 and the substrate W.

The at least one extraction opening 230 may be arranged radially inward and adjacent to the first seal member 220. Thus, there may not be any other features, such as support elements 210, between the at least one extraction opening 230 and the first seal member 220. The extraction opening 230 may be connected to an under pressure source. Thereby any liquid which reaches the extraction opening 230 may be extracted through the main body 201. This means that the liquid is restricted from entering further into the space between the main body surface 202 and the substrate W. The extraction opening 230 can also extract gas, for example when there is no liquid present to be extracted. A mixture of liquid and gas can be extracted through the extraction opening 230. The at least one extraction opening 230 may be used to help provide the pressure drop and/or low pressure region described above.

The at least one extraction opening 230 may be formed by several openings. The extraction openings 230 may be spaced apart from one another all the way round the first seal member 220. The extraction opening 230 may be discreet openings in the main body surface 202. Alternatively, the extraction opening 230 may be a groove formed in the main body surface 202. Alternatively, the groove may be formed in the main body surface 202 and the extraction openings 230 may emerge from the main body 201 at the bottom of the groove. The groove may be segmented with one or more openings in each segment. The segments may be seen as a plurality of recesses.

By connecting the at least one extraction opening 230 to an under pressure, liquid which does find its way to the edge of the substrate W can be removed through the extraction openings 230. Once the edge of the substrate W is no longer covered in liquid, the under surface of the substrate W is dried as the liquid is removed.

As described above, the substrate holder 200 may additionally comprise the second seal member 240. Although FIGS. 4, 5, 6A, 6B, 8 and 9 depict the second seal member 240, this member is optional and may not be provided with the first seal member 220. The second seal member 240 may be positioned radially inward of the at least one extraction opening 230 (if provided). The second seal member 240 may be positioned radially outward of the support elements 210. The second seal member 240 may be configured to surround the at least one support element 210. Thus, all of the support elements 210 may be radially inward of the second seal member 240. Alternatively, at least one of the support elements 210 may be radially outward of the second seal member 240. In other words, the second seal member 240 may be radially inwards of one or more support elements 210. For example, at least the radially outermost support element 210 may be positioned between the first seal member 220 and the second seal member 240. The at least the radially outermost support element 210 may be arranged alternatingly with the at least one extraction opening 230 in a line surrounding the second seal member 240.

Additionally or alternatively to the embodiments described above, the substrate holder 200 may comprise at least one further member 250. The further member 250 may have a contact region 252 configured to contact the substrate W during loading or unloading of the substrate W. The contact region 252 of the further member 250 may be similar to, and have similar characteristics as described above for the contact region 222 of the first seal member 220. The further member 250 may be provided in addition to the seal unit/first seal member 220 described above. In this embodiment, both the first seal member 220 and the further member 250 may be configured to contact the substrate W during loading and unloading of the substrate W. The further member 250 may have a third height, the third height being less than the first height. In other words, the support element 210 may be taller than the further member 250.

The at least one further member 250 may be referred to below as the further member 250, but it will be understood that references to the further member may also include multiple further members. Thus, the further member 250 may be formed by multiple separate portions or protrusions.

The further member 250 may provide a similar supporting function to the first seal member 220 described above. Thus, the further member 250 may be configured to contact the substrate W during loading and/or unloading of the substrate W. By adding a further member 250 radially outwards of the at least one support element 210, damage to the at least one support element 210 can be reduced or prevented. The further member 250 may act as a sacrificial burl/region.

In further detail, the substrate holder 200 may comprise the further member 250 projecting from the main body surface 202 and having an upper surface 251. The at least one further member 250 may be positioned radially outward of and surrounding the first seal member 220. The upper surface 251 of the further member 250 may have a contact region 252 configured to contact the substrate W during loading and/or unloading of the substrate W. A position of the contact region 252 of the further member 250 is arranged at a distance from the plurality of support elements 210 sufficient enough such that during the loading and/or unloading of the substrate W, a force applied to the further member 250 by the substrate W is greater than a force applied to the plurality of support elements 210 by the substrate W.

The further member 250 may comprise a coating 254 as described above. Thus, the coating may be formed of diamond-like carbon (DLC, e.g. a-CH), diamond, silicon carbide (e.g. SiSiC or SiC), boron nitride (BN) or boron carbon nitride (BCN). The coating 254 may form the upper surface 251 of the further member 250 and the contact region 252 of the further member 250 may be on the coating 254. The coating 254 may have other characteristics, such as thickness, etc. as described above in relation to the seal member coating 224 and/or the support member coating 214. The coating 254 of the further member 250 may otherwise be referred to as the further member coating.

Figure 8:
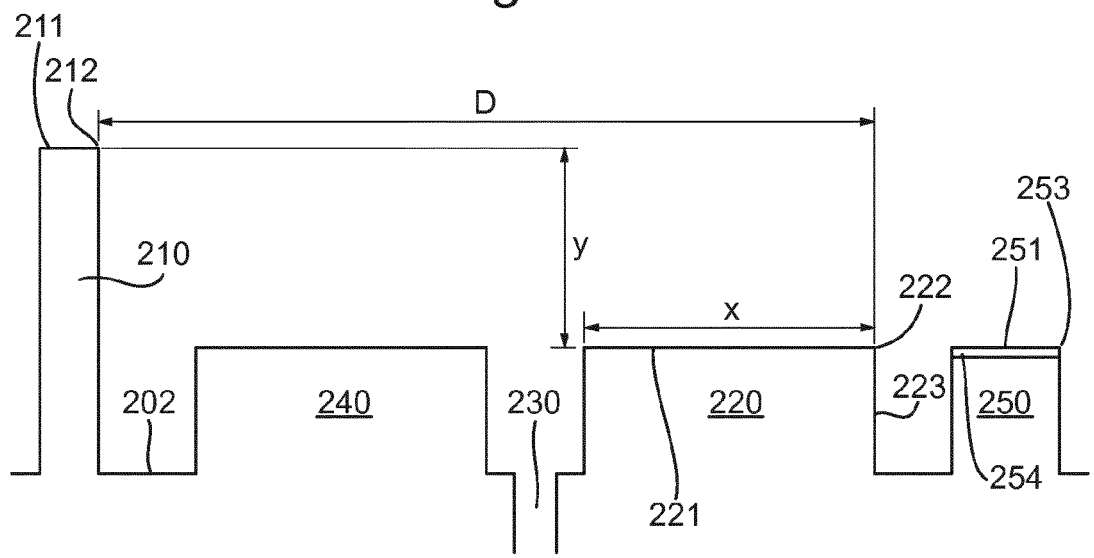
FIG. 8 depicts, in cross section, an edge of a substrate holder according to an embodiment of the present invention.

The coating 254 is shown in FIG. 8. However, the further member 250 could be provided in combination with the first seal member 220, as described above, without the coating 254. The coating 254 of the further member 250 may only be provided on the contact region 252 of the further member 250.

In another embodiment, the substrate holder 200 may comprise an alternative seal member 260 and a further member 250. The alternative seal member 260 may replace the first seal member 220 described above. In this embodiment, only the further member 250 may have a contact region 252 configured to contact the substrate W during loading and/or unloading of the substrate W. In other words, in this embodiment, the alternative seal member 260 is not configured to contact the substrate W during loading and/or unloading of the substrate W as in the above described embodiments. For example, the alternative seal member 260 may be positioned such that it does not contact the substrate W during loading or unloading, e.g. the alternative seal member 260 may be too far radially inwards to contact the substrate W during loading and/or unloading. The alternative seal member 260 may thus provide a seal, e.g. by reducing or affecting gas/fluid flow as described above in relation to the first seal member 220, but does not contact the substrate W during loading and/or unloading as is done by the first seal member 220.

In further detail, the substrate holder 200 comprises a main body 201, a plurality of support elements 210, a seal unit and at least one further member 250. The main body 201 has a main body surface 202. The plurality of support elements 210 project from the main body surface 202. Each support element 210 may have a distal end surface 211 configured to support the substrate W and a first height. The seal unit may be configured to restrict the passage of liquid and/or gas between the substrate W and the main body surface 202 radially inwards past the seal unit. The seal unit may comprise a first seal member 220 projecting from the main body surface 202. The first seal member 220 may have a second height less than the first height. The first seal member 220 may be positioned radially outwards of and surrounding the plurality of support elements 210. The at least one further member 250 projects from the main body surface 202 and has an upper surface 251. The at least one further member 250 may be positioned radially outward of and surrounding plurality of support elements 210. Additionally, the at least one further member 250 may be positioned radially outward of and surrounding the seal unit. The at least one further member 250 may comprise a coating 254 forming the upper surface 251 of the further member

250. The coating 254 may have a contact region 252 configured to contact the substrate W during loading and/or unloading of the substrate W. The coating 254 may be made of diamond-like carbon (DLC, e.g. a-CH), diamond, silicon carbide (e.g. SiSiC or SiC), boron nitride (BN) or boron carbon nitride (BCN). A position of the contact region 252 of the further member 250 may be arranged at a distance from the plurality of support elements 210 sufficient enough such that during the loading and/or unloading of the substrate W, a force applied to the further member 250 by the substrate W is greater than a force applied to the plurality of support elements 210 by the substrate W.

In this embodiment, the seal unit may comprise an alternative seal member 260 as described above. The alternative seal member 260 may project from the main body surface 202. The alternative seal member 260 may be radially outwards of the plurality of supports elements 210. The alternative seal member 260 may be surrounding the plurality of support elements 210. The alternative seal member 260 may function in the same way as the first seal member 220 described above. However, in this embodiment, the alternative seal member 260 may be configured such that it does not generally contact the substrate W during loading and/or unloading. The seal unit may comprise a second seal member 240 as described above. Thus, the second seal member 240 may project from the main body surface and may be positioned radially inwards of the alternative seal member 260.

In either of the embodiments comprising the further member 250 may have similar characteristics to the first seal member 220 described above. For example, the further member 250 may have a contact region having a profile as described above in relation to the first seal member 220 in accordance with FIGS. 6A, 6B and 7A-7G. In further detail, the profile of the contact region 252 of the further member 250, in a cross-section through the further member 250 in a radial direction, may have a shape which is configured such that during the loading and/or unloading of the substrate W, the substrate W contacts the further member 250 via at least two different points of the profile. The further member 250 may comprise a coating 254 only on the contact region 252 having the profile, as described for the first seal member 220 as shown in FIG. 6B.

The further member 250 may be provided in the shape of a continuous ring. In other words, the further member 250 may be circular in plan, or more specifically ring-shaped or annular shaped. Thus, the further member 250 may have an annular shape. The further member 250 may comprise a plurality of segments and may optionally be a segmented ring. In the segmented ring, there may be multiple further member portions with a gap between each neighboring further member portion. The further member portions may be referred to as radial spokes. The gap between neighboring further member portions may be the same length or shorter than the length of either or both of the neighboring portions. In other words, the distance between each further member portion may be the same as, or less than, the width of one or both of the neighboring further member portions. At least one of the gaps between neighboring further member portions, i.e. the spacing between neighboring portions, may be in the order of tens or hundreds of microns. At least one of the gaps between neighboring further member portions may be as narrow as approximately 10 microns. At least one of the gaps may be between 0.5-5 mm. Some or all of the gaps may have these dimensions. Providing small gaps may be advantageous is that any contamination, for example from interaction between the further member 250 and the underside of the substrate W can be caught in the gaps whilst still providing a relatively large contact area.

The further member 250 may be provided by a row of multiple individual burls or protrusions which are spaced to form a ring shape in plan. In other words, the further member 250 may comprise a plurality of further support elements. For example, the individual burls or protrusions may have a diameter of approximately 100-1000 microns. The distance from the middle of one burl or protrusion to the middle of a neighboring burl or protrusion may be approximately 1-3 mm. The upper surface 251 of the further member 250 may be slightly rounded or polished as described in relation to the first seal member 220 above, to reduce wear of the further member 250.

The further member 250 may have a height (the third height) which is less than the height of the at least one support element 210. This means that the further member 250 can take the load during the loading and unloading of the substrate W. However, during use, such as during exposure of the substrate W, the further member 250 may not be in contact with the substrate W. The distance between the further member 250 and the at least one support element 210 may be optimized as described above in FIG. 4 for the first seal member 220.

Figure 9:
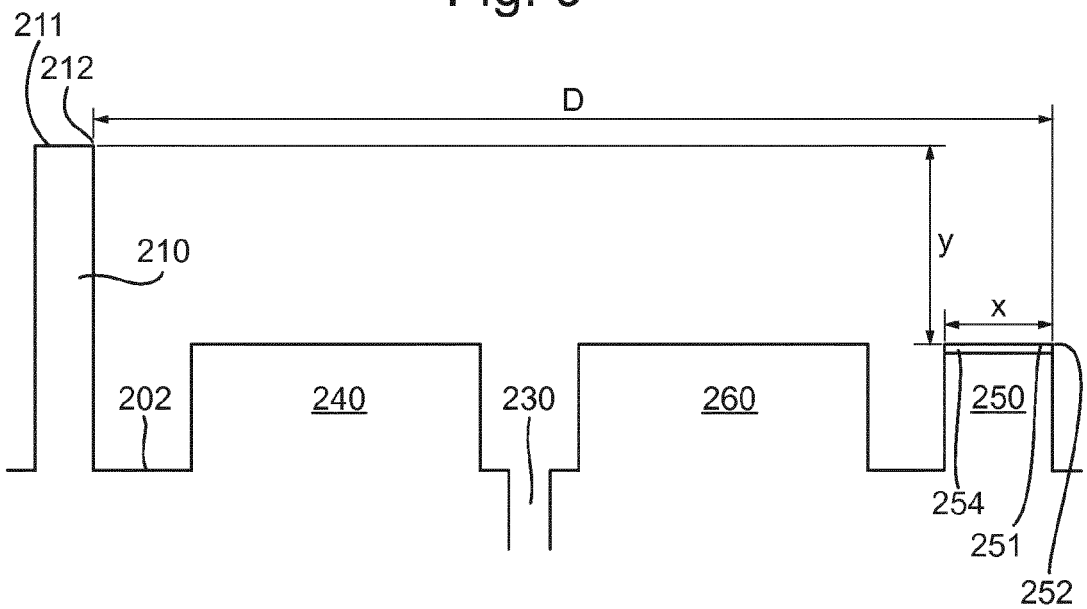
FIG. 9 depicts, in cross section, an edge of a substrate holder according to an embodiment of the present invention.

The position of the contact region 252 of the further member 250 relative to the support elements 210 may be controlled in various different ways. For example, as shown in FIG. 9, the main dimensions relate to the distance between a radially outer edge 212 of distal end surface 211 of the radially outermost support elements 210 and an outer upper edge of the upper surface 251 of the further member 250. The dimensions relate to these specific parts of the support element 210 and the further member 250 because these are the parts of these components which will come into contact with the under surface of the substrate W during loading and/or unloading of the substrate W.

The distance may be defined by a distance D in the radial direction. The distance may be additionally or alternatively defined by the distance y between the distal end surface 211 of the support element 210 and the upper surface 251 of the further member 250. Both of these distances will affect how the substrate W interacts with each of these components during loading and/or unloading.

In this example, the contact region 252 is shown as an edge contact point in the cross section. Thus, in this embodiment, the contact region 252 is formed by the same contact point around the circumference of the further member 250. This contact region 252 may be similar to the contact region for the first seal member 220 shown in FIG. 4. The position of the contact region 252 with respect to the support element 210 is configured to reduce the wear of the support element 210 during unloading of the substrate W.

In an embodiment the radial distance D from a radially outer edge 212 of the distal end surface 211 to the contact region 252 is greater than 1,000 microns, and preferably greater than 1,500 microns. The radial distance D is preferably between approximately 1000-3000 microns, i.e. 1-3 mm. This means that the contract region 252 can be far enough away from the support element 210 to reduce contact between the support elements 210 and the substrate W during loading and/or unloading. Additionally or alternatively, the difference in height between radially outermost support element 210 and the further member 250, shown by y in FIG. 9, is between approximately 0.5 microns and 5 microns. Preferably, the difference in height is greater than or equal to 3 microns to reduce the likelihood of the further member 250 contacting the underside of the substrate W during exposure of the substrate W. The difference in height between the radially outermost support element 210 and the further member 250 is the distance between the distal end surface 211 and the upper surface 251 of the further member 250 in a y direction, wherein the y direction is orthogonal to a plane including the radial direction. Having a difference in height can also reduce contact between the support elements 210 and the substrate W during loading and/or unloading.

Providing the contact region 252 at such a distance means that during loading and/or unloading of the substrate W, the substrate W will have greater interaction with the further member 250 rather than the radially outermost support elements 210. Effectively, this means that the further member 250 is used as a sacrificial wear area. This can lead to significant reduction in the wear of the outermost support elements 210. The distance between the radially outer edge 212 and the contact region 252 can be optimized in the radial direction and/or the y direction to minimize friction between the outermost support elements 210 and the substrate W during loading and/or unloading the substrate W. The optimum values for the distance D and the distance y may vary depending on the substrate holder 200 and/or the substrate W and/or the applications being applied to the substrate W.

Figure 10:
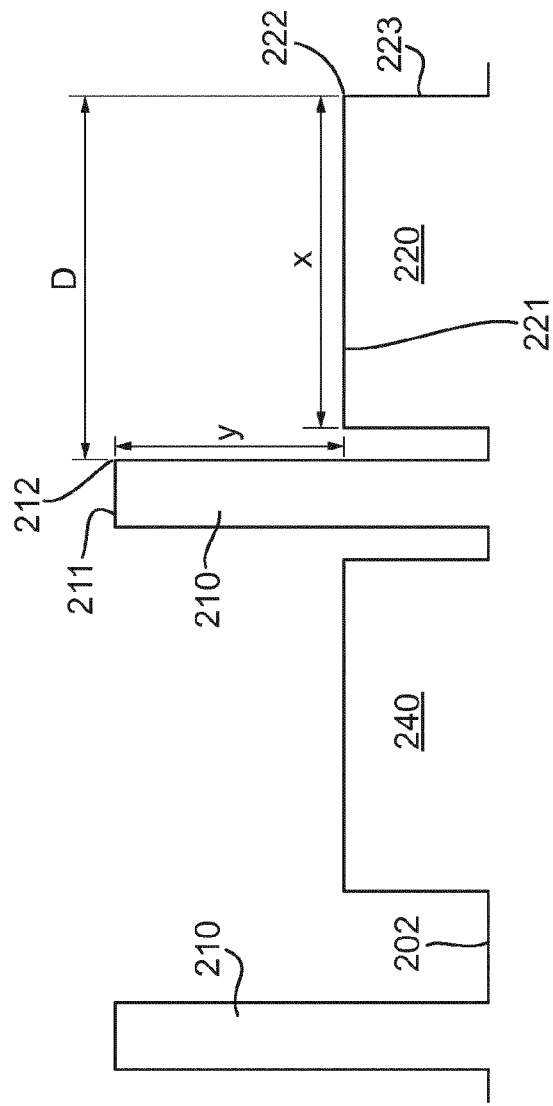
FIG. 10 depicts, in cross section, an edge of a substrate according to an embodiment of the present invention.

As indicated above, the substrate holder 200 may comprise at least one support element 210 between the first seal member 220 and the second seal member 240. This is shown in FIG. 10. Thus, the outermost support element 210 may be provided adjacent to the first seal member 220 and the second seal member 240. Therefore, the second seal member 240 may only surround some, but not all, of the support elements 210.

In this instance, as with the first seal member 220 depicted in FIG. 4, the distance between the contact region 222 and the support element 210 may be defined by a distance D in the radial direction shown in FIG. 10. This may be the same value/range as the distance D referred to in FIG. 4 and described above. The distance may additionally or alternatively be defined by the distance y between the distal end surface 211 of the support element 210 and the upper surface 221 of the first seal member 220. This may be the same value/range as the distance y referred to in FIG. 4 and described above. The distance x is the full length of the first seal member 220. This may be the same values/range as the distance x referred to in FIG. 4 and described above. All of these distances will affect how the substrate W interacts with each of these components during unloading.

Multiple support elements 210 may be provided between the first seal member 220 and the second seal member 240. Optionally, at least one extraction opening 230 may also be provided. For example, support elements 210 and extraction openings 230 may be alternated in the space between the first seal member 220 and the second seal member 240. In other words, FIG. 10 shows a cross section through part of the substrate holder 200 through an outermost support element 210 between the first seal member 220 and second seal member 240, however, at a different radial position, a similar cross section may show an extraction opening 230 between the first seal member 220 and the second seal member 240 as in FIG. 4.

At least one outermost support element 210 may also be provided in a similar position in other embodiments. For example, the outermost support element 210 may be provided between the first seal member 220 and the second seal member 240 when a further member 250 is provided as in FIG. 8 or between the alternative seal member 260 and the second seal member 240 in FIG. 9. These members may comprise a contact region 222, 252 and/or a coating 254 as described in any of the embodiments or variations described above.

As described above the substrate holder 200 may be configured to control the pressure between the main body 201 and the substrate W when the substrate W is being unloaded. This may be done in various ways and any known method/system may be used. An embodiment of the present invention may comprise a lithographic apparatus as described in any of the above examples of variations. The lithographic apparatus may comprise a substrate holder 200 configured to support the substrate according to any of the described embodiments or variations.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

The drawings are intended to illustrate the various features described above. The drawings are not to scale. The relative widths and heights of different features may vary with respect to other features. For example, the further member 250 is shown to be narrower than the first seal member 220 and the second seal member 240. However, the further member 250 may be the same width (i.e. same length in the x direction), or may be wider (i.e. have a larger length in the x direction).

Embodiments are provided according to the following clauses:

1. A substrate holder for use in a lithographic apparatus and configured to support a substrate, the substrate holder comprising:
    a main body having a main body surface;
    a plurality of support elements projecting from the main body surface, wherein each support element has a distal end surface configured to support the substrate and a first height;
    a seal unit comprising a first seal member projecting from the main body surface, the first seal member having an upper surface and a second height less than the first height and being positioned radially outward of and surrounding the plurality of support elements, the upper surface having a contact region configured to contact the substrate during loading and/or unloading of the substrate; and
    wherein a position of the contact region is arranged at a distance from the plurality of support elements sufficient enough such that during the loading and/or unloading of the substrate, a force applied to the first seal member by the substrate is greater than a force applied to the plurality of support elements by the substrate.

2. The substrate holder of clause 1, wherein the contact region is positioned adjacent to a radially outer edge of the first seal member and the radial distance from a radially outer edge of the distal end surface to the contact region is greater than 1,000 microns and preferably, greater than 1,500 microns, and/or wherein the length of the first seal member in a radial direction is greater than 300 microns, and preferably, greater than 500 microns.

3. The substrate holder of clause 1 or clause 2, wherein a profile of the contact region, in a cross section through the first seal member in a radial direction, has a shape which is configured such that during the loading and/or unloading of the substrate, the substrate contacts the first seal member via at least two different points of the profile, and/or the substrate holder further comprising at least one further member projecting from the main body surface and having an upper surface, the at least one further member being positioned radially outward of and surrounding the seal unit, the upper surface of the further member having a contact region configured to contact the substrate during loading and/or unloading of the substrate, wherein a position of the contact region of the further member is arranged at a distance from the plurality of support elements sufficient enough such that during the loading and/or unloading of the substrate, a force applied to the further member by the substrate is greater than a force applied to the plurality of support elements by the substrate.

4. The substrate holder of any of clauses 1-3, wherein the plurality of support elements, the first seal member, or both comprise a coating made of diamond-like carbon, diamond, silicon carbide, boron nitride or boron carbon nitride, and the coating forms the distal end surface of the plurality of support elements and/or forms the upper surface of the first seal member, and the contact region of the first seal member is on the coating, and/or the at least one further member comprising a coating made of diamond-like carbon, diamond, silicon carbide, boron nitride or boron carbon nitride, wherein the coating forms the upper surface of the further member and the contact region of the further member is on the coating of the further member.

5. A substrate holder for use in a lithographic apparatus and configured to support a substrate, the substrate holder comprising:
   a main body having a main body surface;
   a plurality of support elements projecting from the main body surface, wherein each support element has a distal end surface configured to support the substrate and a first height;
   a seal unit comprising a first seal member projecting from the main body surface, the first seal member having a second height less than the first height and being positioned radially outward of and surrounding the plurality of support elements,
   at least one further member projecting from the main body surface and having an upper surface, the at least one further member being positioned radially outward of and surrounding the seal unit, the at least one further member comprising a coating forming the upper surface of the further member, the coating having a contact region configured to contact the substrate during loading and/or unloading of the substrate, wherein the coating is made of diamond-like carbon, diamond, silicon carbide, boron nitride or boron carbon nitride; and
   wherein a position of the contact region of the further member is arranged at a distance from the plurality of support elements sufficient enough such that during the loading and/or unloading of the substrate, a force applied to the further member by the substrate is greater than a force applied to the plurality of support elements by the substrate.

6. The substrate holder of clause 4 or clause 5, wherein a profile of the contact region of the further member, in a cross section through the further member in a radial direction, has a shape which is configured such that during the loading and/or unloading of the substrate, the substrate contacts the further member via at least two different points of the profile.

7. The substrate holder of any of clauses 4-6, wherein the further member has a third height less than the first height, and/or wherein the further member has an annular shape and comprises a plurality of segments, and/or wherein the further member comprises a plurality of further support elements.

8. A substrate holder for use in a lithographic apparatus and configured to support a substrate, the substrate holder comprising:
   a main body having a main body surface;
   a plurality of support elements projecting from the main body surface, wherein each support element has a distal end surface configured to support the substrate and a first height;
   a seal unit comprising a first seal member projecting from the main body surface, the first seal member having an upper surface and a second height less than the first height and being positioned radially outward of the plurality of and surrounding the support elements, and the upper surface having a contact region configured to contact the substrate during loading and/or unloading of the substrate; and
   wherein a profile of the contact region, in a cross section through the first seal member in a radial direction, has a shape which is configured such that during the loading and/or unloading of the substrate, the substrate contacts the first seal member via at least two different points of the profile.

9. The substrate holder of clause 3, clause 6 or clause 8, wherein the shape of the profile is linear from the upper surface of the first seal member to a radially outer edge of the first seal member, and/or wherein the shape of the profile comprises multiple linear portions from an upper surface of the first seal member to a radially outer edge of the first seal member, and/or wherein the shape of the profile is substantially step-shaped, and/or wherein the shape of the profile is curved from an upper surface of the first seal member to a radially outer edge of the first seal member.

10. The substrate holder of clause 9, wherein the linear profile from the upper surface of the first seal member to the radially outer edge of the first seal member is at a negative gradient between approximately 0.15 microns/mm to 3 microns/mm relative to the upper surface of the first seal member.

11. The substrate holder of clause 9, wherein the shape of the profile is part of an ellipse or circle.

12. The substrate holder of any of clauses 1-11, wherein the seal unit comprises a second seal member projecting from the main body surface and positioned radially inward of the first seal member, the second member configured to restrict the passage of liquid between the substrate and the main body surface radially inward past the second seal member, and/or wherein the first seal member is configured to provide a pressure drop radially inward of the first seal member relative to the pressure in a region radially outward of the seal unit.

13. The substrate holder of clause 12, wherein the first seal member is configured to provide a low pressure region between the first seal member and the second seal member.

14. The substrate holder of any of clauses 1-13, further comprising at least one extraction opening formed in the main body for the extraction of fluid into the main body from between the main body surface and the substrate, the at least one extraction opening being arranged radially inward of and adjacent to the first seal member, and/or wherein the substrate holder is configured to control the pressure between the main body and the substrate when the substrate is being loaded and/or unloaded.

15. A lithographic apparatus comprising the substrate holder configured to support the substrate according to any of clauses 1-14.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A substrate holder for use in a lithographic apparatus and configured to support a substrate, the substrate holder comprising:
   a main body having a main body surface;
   a plurality of first support elements projecting from the main body surface, wherein each first support element has a distal end surface configured to support the substrate and has a first height;
   a first seal member projecting from the main body surface, the first seal member having an upper surface, having a second height less than the first height and positioned outward of and surrounding the plurality of first support elements;
   one or more second support elements projecting from the main body surface and positioned outwards of the first seal member, wherein each second support element has a distal end surface configured to support the substrate and has the first height and wherein the one or more second support elements are the one or more most outward support elements, projecting from the main body surface, configured to support the substrate; and
   a second seal member projecting from the main body surface and positioned outwards of and surrounding the one or more second support elements and the first seal member, the second seal member having a width in the outwards direction greater than a height of the second seal member from the upper surface,
   wherein the plurality of first support elements, the first seal member, the second seal member and/or the one or more second support elements comprise a coating made of diamond-like carbon, diamond, silicon carbide, boron nitride or boron carbon nitride, and the coating forms the distal end surface of the plurality of first support elements, forms the distal end surface of the one or more second support elements, forms the upper surface of the first seal member and/or forms the upper surface of the second seal member.

2. The substrate holder of claim 1, wherein the second seal member comprises an upper surface having a contact region configured to contact the substrate during loading and/or unloading of the substrate, and a position of the contact region is arranged at a distance from the one or more second support elements sufficient enough such that during the loading and/or unloading of the substrate, a force applied to the second seal member by the substrate is greater than a force applied to the one or more second support elements by the substrate.

3. The substrate holder of claim 2, wherein the contact region is positioned adjacent to an outer edge of the second seal member and the distance from an outer edge of a distal end surface of the one or more second support elements to the contact region is greater than 1,000 microns, and/or wherein the length of the second seal member in an outward direction is greater than 300 microns.

4. The substrate holder of claim 3, wherein the distance is greater than 1,500 microns, and/or wherein the length is greater than 500 microns.

5. The substrate holder of claim 1, comprising a contact region positioned outward of the one or more second support elements, the contact region at a third height less than the first height and configured to contact the substrate during loading and/or unloading of the substrate and wherein a profile of the contact region, in a cross section through the contact region in an outward direction, has a shape which is configured such that during the loading and/or unloading of the substrate, the substrate contacts the contact region via at least two different points of the profile.

6. The substrate holder of claim 5, wherein the shape of the profile is linear from an upper surface of a contact member protruding from the main body surface to an outer edge of the contact member, and/or wherein the shape of the profile comprises multiple linear portions from an upper surface of a contact member protruding from the main body surface to an outer edge of the contact member, and/or wherein the shape of the profile is substantially step-shaped, and/or wherein the shape of the profile is curved from an upper surface of a contact member protruding from the main body surface to an outer edge of the contact member.

7. The substrate holder of claim 1, further comprising at least one further member projecting from the main body surface and having an upper surface, the at least one further member positioned outward of and surrounding the first seal member, the upper surface of the further member having a contact region configured to contact the substrate during loading and/or unloading of the substrate, and a position of the contact region of the further member is arranged at a distance from the plurality of support elements sufficient enough such that during the loading and/or unloading of the substrate, a force applied to the further member by the substrate is greater than a force applied to the plurality of support elements by the substrate.

8. The substrate holder of claim 7, wherein the at least one further member comprises a coating made of diamond-like carbon, diamond, silicon carbide, boron nitride or boron carbon nitride, wherein the coating forms the upper surface of the at least one further member and the contact region of the at least one further member is on the coating of the at least one further member.

9. The substrate holder of claim 1, further comprising at least one extraction opening formed in the main body for the extraction of fluid into the main body from between the main body surface and the substrate, the at least one extraction opening arranged outwards of and adjacent to the first seal member.

10. The substrate holder of claim 1, configured to control a pressure between the main body and the substrate when the substrate is being loaded and/or unloaded.

11. A lithographic apparatus comprising the substrate holder of claim 1.

12. A substrate holder for use in a lithographic apparatus and configured to support a substrate, the substrate holder comprising:
- a main body having a main body surface;
- a plurality of support elements projecting from the main body surface, wherein each support element has a distal end surface configured to support the substrate and has a first height;
- a first seal member projecting from the main body surface, the first seal member having a second height less than the first height and positioned outward of and surrounding the plurality of support elements;
- at least one extraction opening formed in the main body for the extraction of fluid into the main body from between the main body surface and the substrate when supported by the plurality of support elements, the at least one extraction opening arranged outward of the plurality of support elements and inward of and adjacent to the first seal member; and
- a second seal member projecting from the main body surface, the second seal member having a third height less than the first height and positioned outward of and surrounding the first seal member and the at least one extraction opening; and
- a further member projecting from the main body surface and having an upper surface, the further member positioned outward of and surrounding the second seal member, the upper surface of the further member having a fourth height less than the first height and having a contact region configured to contact the substrate during loading and/or unloading of the substrate.

13. The substrate holder of claim 12, wherein the contact region is positioned adjacent to an outer edge of the further member and the distance from an outer edge of the distal end surface of a support element nearest to the contact region is greater than 1,000 microns, and/or wherein a length of the further member in the outward direction is greater than 300 microns.

14. The substrate holder of claim 13, wherein the distance is greater than 1,500 microns, and/or wherein the length is greater than 500 microns.

15. The substrate holder of claim 12, wherein a profile of the contact region, in a cross section through the further member, has a shape which is configured such that during the loading and/or unloading of the substrate, the substrate contacts the further member via at least two different points of the profile.

16. The substrate holder of claim 15, wherein the shape of the profile is linear from the upper surface of the further member to an outer edge of the further member, and/or wherein the shape of the profile comprises multiple linear portions from an upper surface of the further member to an outer edge of the further member, and/or wherein the shape of the profile is substantially step-shaped, and/or wherein the shape of the profile is curved from an upper surface of the further member to an outer edge of the further member.

17. The substrate holder of claim 15, wherein the shape of the profile is part of an ellipse or circle.

18. The substrate holder of claim 12, wherein the plurality of support elements, the further member, or both comprise a coating made of diamond-like carbon, diamond, silicon carbide, boron nitride or boron carbon nitride, and the coating forms the distal end surface of the plurality of support elements and/or forms the upper surface of the further member.

19. A lithographic apparatus comprising the substrate holder of claim 12.

20. The substrate holder of claim 12, configured to control a pressure between the main body and the substrate when the substrate is being loaded and/or unloaded.

* * * * *